United States Patent [19]

Iwaki et al.

[11] Patent Number: 5,414,719
[45] Date of Patent: May 9, 1995

[54] OPERATING CIRCUIT FOR GALOIS FIELD

[75] Inventors: Tetsuo Iwaki, Yamoto-Koriyama; Toshihisa Tanaka, Sakura; Eiji Yamada, Tenri, all of Japan

[73] Assignee: Sharp Kabushiki Kaisha, Osaka, Japan

[21] Appl. No.: 46,853

[22] Filed: Apr. 15, 1993

[30] Foreign Application Priority Data

| Apr. 24, 1992 | [JP] | Japan | 4-107015 |
| May 1, 1992 | [JP] | Japan | 4-112596 |
| May 12, 1992 | [JP] | Japan | 4-118918 |
| May 12, 1992 | [JP] | Japan | 4-118919 |
| May 12, 1992 | [JP] | Japan | 4-118920 |
| Jul. 23, 1992 | [JP] | Japan | 4-197244 |

[51] Int. Cl.$^6$ .......................................... G06F 11/10
[52] U.S. Cl. .................................. 371/37.1; 364/746.1
[58] Field of Search ................. 364/746.1; 371/37.1, 371/37.4, 37.5, 43

[56] References Cited

U.S. PATENT DOCUMENTS

| 4,566,105 | 1/1986 | Oisel et al. | 371/37.5 |
| 4,597,083 | 6/1986 | Stenerson | 371/37.2 |
| 4,797,848 | 1/1989 | Walby | 364/754 |
| 4,845,713 | 7/1989 | Zook | 371/37.1 |
| 4,847,840 | 7/1989 | Jingusi | 371/37.1 |
| 4,958,349 | 9/1990 | Tanner et al. | 371/37.1 |
| 4,975,915 | 12/1990 | Sako et al. | 371/37.1 |

OTHER PUBLICATIONS

Proceedings of Institute of Television Engineers of Japan, pp. 227-228, Shirota et al: "A Structure of Error Correction LSI", date unknown.
Murakami et al: "Signal Processor LSI for Digital VTR," Journal of Institute of Television Engineers of Japan, vol. 43, No. 12, pp. 1333-1339, 1989.
Nakase et al: "Control Method of Reed-Solomon Decoder for Digital VTRs," pp. 115-116, Proceedings of ITEC'91, 1991.

Primary Examiner—Paul P. Gordon
Attorney, Agent, or Firm—Nixon & Vanderhye

[57] ABSTRACT

An operating circuit of a Galois Field for executing an operation of the Galois field efficiently and rapidly includes an operating circuit (11) for receiving two elements of a Galois field, for performing an addition or a multiplication of the two elements, and for outputting a first operational result, an operating circuit (12) for receiving another two elements of the Galois field, for performing an addition or a multiplication of another two elements, and for outputting a second operational result, an operating circuit (13) for performing an addition of the first operational result and the second operational result on the Galois field, and for outputting a third operational result, a multiplexer (14) for selecting and one of the first operational result and the third operational result, and for outputting a selected result, a multiplexer (15) for selecting any one of the second operational result and the third operational result, and for outputting the selected result, a flag-decision circuit (18) for determining the first operational result and the second operational result as well as the third operational result.

68 Claims, 15 Drawing Sheets

OPERATING CIRCUIT FOR GALOIS FIELD

BACKGROUND OF THE INVENTION

1. The Field of the Invention

The present invention relates to an operating circuit for Galois field included in am error correcting circuit which operates to code and decode an error detecting code or an error correcting code appearing when transmitting or recording and reproducing digital information, in particular, a Reed-Solomon code.

2. Description of the Related Arts

In general, a coder for coding digital information and a decoder for decoding transmitted or recorded or reproduced data will be referred to as an error correcting circuit.

In order to perform coding and decoding in the error correcting circuit, an operating circuit on a Galois field (referred to as a Galois field operating circuit) is an essential element.

The Galois field operating circuit is required to perform addition, subtraction and multiplication on the Galois field. If the number of the elements on the Galois field is a power of 2, subtraction on the Galois field is equivalent to addition on the Galois field.

The digital information recording and reproducing apparatus such as a compact disk or a digital audio tape recorder performs an error correction based on $2^8=256$ elements on the Galois field. Hence, the Galois field operating circuit is required to perform only an addition and a multiplication on the Galois field.

The inventors of the present invention know a Galois field operating circuit having one addition and multiplication unit which takes the operating steps of receiving an input of two elements X and Y of the Galois field, performing an addition like $Z=X+Y$ and a multiplication like $Z=X\times Y$ and feeding an operational result Z, where $+$ and $\times$ denote addition and multiplication on the Galois field, respectively.

The above-mentioned Galois field operating circuit is capable of performing just one of an addition and a multiplication at a time. The use of this Galois field operating circuit makes it possible to perform any kind of calculation by repeating an addition and a multiplication.

For example, in order to calculate a determination of a two-dimensional matrix $(a_{ij})$, three operations are executed in series as follows;

$$F=a_{11}\times a_{22}$$

$$G=a_{21}\times a_{12}$$

$$Z=F+G$$

where F and G denote intermediate results stored in an internal register provided inside of the error correcting circuit.

However, as the data transfer speed becomes faster, the error correction is required to be faster. With the higher recording density of a digital video cassette recorder (VCR), the error rate is made higher and higher in the recorder. Hence, such a device as a VCR requires a higher error correcting capability. In order to meet the need, there has been proposed a Galois field operating circuit for performing two or more operations at a time.

The inventors of the present invention know another Galois field operating circuit which is arranged to solve a shortcoming of the first Galois field operating circuit just described above.

The second Galois field operating circuit includes two Galois field multipliers and one Galois field adder. This Galois field operating circuit operates to receive four elements X1, X2, Y1 and Y2 of the Galois field, to perform an operation of $Z=X1\times X2+Y1\times Y2$, and feed the operational result Z. For example, to calculate a determination of two-dimensional matrix, the following operations can be taken.

$$Z=a_{11}\times a_{22}+a_{21}\times a_{12}$$

The above-mentioned second Galois field operating circuit is capable of calculating a determination of two-dimensional matrix three times as fast as the first Galois field operating circuit.

However, the second Galois field operating circuit is incapable of performing an addition of $X1+X2$ on the Galois field and an addition of $Y1+Y2$ on the Galois field. For example, in order to obtain a sum of the four elements P, Q, R and S on the Galois field, it is necessary to perform three calculations of $$F=P\times 1+Q\times 1$$

$$G=R\times 1+S\times 1$$

$$Z=F\times 1+G\times 1$$

Moreover, the second Galois field operating circuit is also incapable of outputting two operational results of $X1\times X2$ and $Y1\times Y2$ independently. Hence, in order to obtain a product of the four elements P, Q, R and S of the Galois field, it is necessary to perform three operations of $$F=P\times Q+0\times 0$$

$$G=R\times S+0\times 0$$

$$Z=F\times G+0\times 0$$

It means that one of two multipliers is not used, which disadvantageously leads to an obstacle for an efficient operation.

In the field of error correction, a method for solving an error location polynomial and an error value polynomial has been well known as a method for deriving a location and a value of an error.

In order to solve an error locator polynomial, assuming that a code length of an input data train is n and a primitive element of a Galois field $GF(q^m)$ (where q: a prime number, m: a natural number) is $\alpha$, then $\alpha^{-i}$ ($i=0, 1, 2, \ldots n-1$) is sequentially substituted in the error locator polynomial for obtaining the roots. In order to execute the operation, there are two ways of using dedicated software and Chien search on the hardware. After computing the location and the value of an error through either of these two ways, the input data train is corrected and then the corrected data is output.

At the present time, as the information to be treated becomes larger and larger, it is more and more desirous that the error correction be made more faster.

However, the above-mentioned error correcting method based on the software requires an enormous number of steps when performing a correction on a high-degree level, thereby disadvantageously lowering the processing speed.

The above-mentioned error correcting method using the Chien search in hardware is arranged to match the delayed input data train to the corrected data train in phase before outputting data and to correct an error symbol at a time when it is found. As such, assuming that the input data are $D_{n-1}, D_{n-2}, D_{n-3} \ldots D_1, D_0$, the delayed input data train is sequentially output from the side of $D_{n-1}$, while the Chien search operates to sequentially check the data from the side of $D_0$. Hence, disadvantageously, the sequence of the input data train is not matched to the sequence of the output data having error patterns.

In order to solve the foregoing disadvantages, when coefficients of an error locator polynomial are input to a Chien search circuit, coefficient multipliers are provided before those coefficients are applied to the Chien search circuit. This results in disadvantageously making the circuit bulkier. Further, it is possible to start from $\alpha^{-(n-1)}$ an error location to be substituted for executing the Chien search in the hardware. For that purpose, it is necessary to fix a code length n to be treated in the circuit. This results in impairing the wide availability of the error correcting circuit and making it impossible to constantly set an optimal strategy.

A digital video cassette recorder (VCR) developed for a broadcasting purpose is beneficial since it is able to record a high-quality image as well as to keep the quality of the image constant even though the image is dubbed many times. However, the broadcasting digital VCR operates to record and reproduce the image at a relatively low recording density for suppressing the occurrence of an error appearing when reproducing an image. This result in increasing the consumption of the tape.

In order to make the digital VCR more available for consumer use, it is necessary to develop a signal processing method for suppressing the consumption of tape. Hence, some relevant techniques such as an image compressing technique and a high-density recording technique are under active study.

However, the image compression eliminates redundancy information from the image although it originally provides the redundancy. Hence, it is difficult to conceal the miscorrection. Further, since the inferior circumstance and the high-density recording increase the errors appearing when reproducing an image, the digital VCR for consumer use is required to provide a high error correcting capability.

Further, the image compression serves to compress the original image data into about ⅛ of the data. Hence, the consumer VCR just needs ⅛ the speed for correction as the professional digital VCR. However, the consumer VCR needs ten times the speed for a correction as a digital audio apparatus such as a digital audio tape recorder (DAT).

The inventors of the present invention know an arrangement of the error correcting circuit, which solves above-mentioned difficulty, and which is arranged to have an input unit, an operating unit connected to the input unit, an output unit connected to the operating unit, and a delaying unit connected to both of the input unit and the output unit.

An operation of the above-mentioned error correcting circuit will be described below.

The above-mentioned error correcting circuit is arranged to divide a correcting process into three stages of (1) generating a syndrome and erasure locator, (2) deriving an error location and an error value and checking a corrected result, and (3) outputting the corrected result and executing the three stages through one pipeline.

For example, at the stage (1) of generating a syndrome and erasure locator, the input unit operates to generate a syndrome and an erasure locator while one code passes through the circuit and to pass the generated syndrome and the erasure locator to the next pipeline.

At the next stage (2) of deriving an error location and an error value and checking the corrected result, the operating unit operates to derive an error value from the syndrome and the erasure locator according to a correcting program configured on the decoding strategy and to check the corrected result from the derived error location and error value and then to pass the checked result to the next pipeline.

At the next stage (3) of outputting the corrected result, the output unit operates to add an error value to the data corresponding to the error location derived at the previous stage and to terminate the correcting process.

As described above, a method for deriving an error location and an error value from the syndrome and the erasure locator according to the correcting program makes it possible to execute such a strategic decoding as flexibly optimizing the correcting algorithm by means of information such as an error inclination and a number of erasure flags.

However, if the number of errors to be corrected is relatively small (such as three error correction or four corrections for erasure), the above-mentioned error correcting circuit makes a small amount of calculations in the stage (2) of deriving an error location and an error value and checking the corrected result. Hence, the above-mentioned error correcting circuit facilitates termination of the process of the stage (2) of deriving an error location and an error value before one code passes through the error correcting circuit. This makes it possible to perform a fast processing. However, to enhance the correcting capability such as four error corrections or eight corrections for erasure, for instance, the number of calculations consumed in the error correcting circuit is surprisingly increased, thereby lowering the correcting speed. It means that the above-mentioned error correcting circuit has difficulty in enhancing the correcting speed if the correcting capability is made higher.

In general, as a recording density of digital data becomes higher and higher, several kinds of methods are used for correcting a data error.

For example, in a digital video cassette recorder (VCR), it is known that erroneous correction has an adverse effect on a quality of image than an interpolation can be executed as a result of appearance of an uncorrectable error.

As a method for preventing erroneous correction, if there exists a syndrome sufficiently off from an error and which is not used for obtaining a location and a size of the error, the verification on the syndrome is executed.

The inventors of the present invention know a method for preventing erroneous correction, assuming that the input data is $D_{n-1}, D_{n-2}, D_{n-3} \ldots D_2, D_1$ and $D_0$, one syndrome $S_x$ can be obtained by sequentially applying the input data $D_{n-1}, D_{n-2}, D_{n-3} \ldots D_2, D_1,$ and $D_0$ in a syndrome operating circuit. The syndrome $S_x$ is output as follows when the last input data $D_O$ is read in a flip-flop included in the syndrome operating circuit;

$$S_x = D_{n-1}\alpha^{x(n-1)} + D_{n-2}\alpha^{x(n-2)} + D_{n-3}\alpha^{x(n-3)} + \ldots + D_2\alpha^{2x} + D_1\alpha^x + D_0$$

where + denotes an addition on a Galois field (hereafter, it means the same in all the expressions indicated below), and n denotes a length of a code and $\alpha$ denotes a primitive element of the Galois field $GF(q^m)$.

If no error exists in the data train, the syndrome is made zero and the resulting value is as indicated below;

$$S_x = D_{n-1}\alpha^{x(n-1)} + D_{n-2}\alpha^{x(n-2)} + D_{n-3}\alpha^{x(n-3)} + \ldots + D_2\alpha^{2x} + D_1\alpha^x + D_0$$

where $D_i'$ denotes a value of an error of the input data $D_i$. If an error exists, $D_i'$ denotes its value and if no error exists, it is zero. The location of an error $D_i'$ in the code can be uniquely expressed by $\sigma^i$, where $\alpha^i$ is referred to as an error locator.

As such, it is determined that the correction is terminated when the error value $D_{n-1}'$ to $D_0'$ of each data obtained by an operation is sequentially input to the syndrome operating circuit and the result is matched to the syndrome $S_x$.

As a method for obtaining the location and the value of an error, an error locator polynomial and an error evaluator polynomial may be used.

This method is a method of executing a Chien search arranged to sequentially substitute $\alpha^{-i}$ (i=0, 1, 2 ..., n−1) to the error locator polynomial and deriving an error location and an error value.

However, as a method for preventing the above-mentioned erroneous correction, when generating a syndrome and verifying the corrected-result, the data train is operated on the side of the input data $D_{n-1}$ and is sequentially calculated from the input data $D_0$ when performing the Chien search. Hence, until the Chien search is terminated, it is necessary to wait for the verification. This results in disadvantageously increasing the processing time for correcting an error.

The inventors of the present invention know an error correcting device which is so arranged that by assuming a number of correctable symbols is K (an integer in the range of $1 \leq K$), the error location and the error value obtained by an operation and analyzing unit are stored in each pair of K storage elements. An output of the storage element for storing an error size is applied into a selecting circuit which serves to output an input value or zero in response to a control signal. On the other hand, an address counter operates to count a code length of a data train and to send the count to a comparator. The comparator receives the outputs of K storage elements each for storing an error location. The comparator constantly compares the count of the address counter and with the error location sent from the K storage elements.

The address counter is set to output all the error locations in the data train. Hence, if the error location derived by the operation and analyzing unit is inside of the code, it is certain that the value of one storage element is matched to the count of the address count at one time. Only when both are matched to each other, the comparator sends a control signal to the selecting circuit connected to the storage element for storing an error value for the error location so that the selecting circuit may output the error value. The outputs of the selecting circuits collectively pass through a multiplexer. Since the selecting circuit sends zero as the other output, the multiplexer outputs only one-symbol data. The one-symbol data is added at the symbol to the same location of the delayed input data through the adder for correcting the data train.

However, assuming that the number of correctable symbols is K, the error correcting circuit requires to prepare $2 \times K$ storage elements, K selecting circuits, K comparators, a multiplexer for selecting one symbol of K symbols, and an adder or a subtracter for a correction. It means that a correction for a lot of symbols disadvantageously requires a large amount of circuit arrangement.

The Reed-Solomon code arranges each symbol of a code word on the Galois field $GF(2^b)$ (b denotes a natural number) and an operating process of the Reed-Solomon code is performed on the Galois field.

In decoding the Reed-Solomon code, in particular, the inventors of the present invention know a decoding method operating to perform a correction for an erasure (correction to be done if where an error is located is determined) and a correction for an error (referred to as erasure plus error correction), which will be described later.

The description will be directed to the above-mentioned decoding method for correcting an erasure.

If the number h of erasure meets with a relation of $1 \leq h \leq d-1$, where d represents the minimum distance of the code, then the error value of erasure is obtained by solving the h-stage simultaneous linear equations of $$s_k = \sum_{i=1}^{h} X_i^k E_i, \text{ where } k = 0, 1, \ldots, d-2$$

where $s_k$ denotes a syndrome, $X_i$ denotes a locator of an i-th erasure, and $E_i$ denotes an error value of an i-th erasure, with h, $s_k$ and $X_i$ are known and $E_i$ is an unknown.

In order to solve the simultaneous linear equations indicated in the above expression, the following method has been used. That is, assuming that an error evaluator polynomial $U(z)$ and an error locator polynomial $\lambda(z)$ are:

$$U(z) = \sum_{i=1}^{h} \left\{ E_i \prod_{\substack{j=1 \\ j \neq i}}^{h} (1 - X_j z) \right\} = \sum_{i=0}^{h-1} U_i z^i$$

and $$\lambda(z) = \prod_{i=1}^{h} (1 - X_i z) = \sum_{i=0}^{h} \lambda_i z^i$$

the solution of $$E_i = U(x_i^{-i})/\lambda_{odd}(X_i^{-i}),$$

with i=1, 2 ...... h, can be obtained, where $\lambda_{odd}(z)$ stands for a sum of an odd degree components of the error locator polynomial $\lambda(z)$. That is, $$\lambda_{odd}(z) = \sum_{i=0}^{k} \lambda_{2i+1} z^{2i+1}$$

where k is the largest integer which does not exceed a real number of h/2.

The term coefficients $U_0, U_1 \ldots U_{h-1}$ of the error evaluator polynomial U (z) are allowed to be derived by the following relation of $$\lambda(z) \left( \sum_{i=0}^{d-2} s_i z^i \right) = U(z) \pmod{z^{d-1}}$$

Next, the description will be oriented to the decoding method for erasure plus error correction.

If m errors appear in addition to h erasure, the erasure plus error correction means obtaining an error value of an erasure and an error by solving the n-stage simultaneous linear equations of $$s_k = \sum_{i=1}^{n} X_i^k E_i$$

where $k=0, 1 \ldots d-2$, and where $n=h+m$ is established, $X_i$ denotes a locator of an (i-h) th error, $E_i$ denotes an error value of an (i-h) th error, with h, $s_k$ and $X_i$ ($1 \leq i \leq h$) are known, and m, $X_i$ ($h+1 \leq i \leq n$) and $E_i$ are unknowns. If the relation of $h+2m \leq d-1$ is not satisfactory, no erasure plus error correction is allowed.

The following method is used as a solution of the simultaneous linear equations indicated by the above expression. That is, like the solution for the erasure correction, assuming that the error evaluator polynomial $\omega$ (z) and the error locator polynomial $\eta$ (z) are:

$$\omega(z) = \sum_{i=1}^{n} \left\{ E_i \prod_{\substack{j=1 \\ j \neq i}}^{n} (1 - X_j z) \right\} = \sum_{i=0}^{n-1} \omega_i z^i$$

and $$\eta(z) = \prod_{i=1}^{n} (1 - X_i z) = \sum_{i=0}^{n} \eta_i z^i$$

the solution of $$E_i = \omega(X_i^{-i})/\eta \text{ odd } (X_i^{-i}),$$

with $i = 1, 2 \ldots n$, can be obtained, where $\eta_{odd}(z)$ stands for a sum of odd degree term components of the error locator polynomial $\eta$ (z) as follows.

$$\eta_{odd}(z) = \sum_{i=0}^{k} \eta_{2i+1} z^{2i+1}$$

where k is the largest integer which does not exceed a real number of n/2.

The term coefficients $\omega_0, \omega, \ldots \omega_{n-1}$ of the error evaluator polynomial $\omega$ (z) are obtained by the following relation of $$\eta(z) \left( \sum_{i=0}^{d-2} s_i z^i \right) = \omega(z) \pmod{z^{d-1}}$$

In a case of performing an erasure plus error correction, since the error number m and the error locator $X_i$ ($h+1 \leq i \leq n$) are unknown it is necessary to derive those values in advance. For this purpose, it is necessary to derive the error locator polynomial $\sigma$ (z) dedicated to the error and a polynomial T(z) with respect to z meeting the following expression, $$\sigma(z) = \prod_{i=1}^{m} (1 - X_{h+i} z) = \sum_{i=0}^{m} \sigma_i z^i$$

and $$T(z) = \sum_{i=0}^{d-2} T_i z^i,$$

$$T(z) = \lambda(z) \left( \sum_{i=0}^{d-2} s_i z^i \right) \pmod{z^{d-1}}$$

The error number m is obtained as the largest integer allowing the following m-degree regular matrix $G_{h,m}$ to be non-singular. If $C_{h,1}$ is singular, m is given as $m=0$. If $m=0$, it is determined that no error but only erasure appear. Hence, the erasure correction is carried out;

$$G_{h,m} = \begin{pmatrix} T_{h+m-1} & T_{h+m-2} & \cdots & T_h \\ T_{h+m} & T_{h+m-1} & \cdots & T_{h+1} \\ \cdot & \cdot & & \cdot \\ \cdot & \cdot & \cdots & \cdot \\ \cdot & \cdot & \cdots & \cdot \\ T_{h+2m-2} & T_{h+2m-3} & & T_{h+m-1} \end{pmatrix}$$

The error locator $X_{h+1}, X_{h+2} \ldots X_n$ are obtained as inverses to the roots $X_{h+1}^{-1}, X_{h+2}^{-1}, \ldots X_n^{-1}$ of an equation $\sigma(z)=0$. If only errors exist, the coefficients $\sigma_1, \sigma_2, \ldots \sigma_m$ of the error locator polynomial $\sigma_{(z)}$ can be uniquely obtained by solving the following linear equation of;

$$G_{h,m} = \begin{pmatrix} \sigma_1 & T_{h+m} \\ \sigma_1 & T_{h+m+1} \\ \cdot & \cdot \\ \cdot & \cdot \\ \cdot & \cdot \\ \sigma_m & T_{h+2m-1} \end{pmatrix}$$

The linear equation of the above expression will be a briefly discussed. In the previously mentioned expression, the equation $\eta$ (z)=$\lambda$(z)$\sigma$ (z) an the definition of T(z) result in establishing the following expression of:

$$T(z)\sigma(z) = \omega(z) \pmod{z^{d-1}}$$

In the above expression, $\omega$ (z) at the right side is a (n-1) th degree expression. Hence, the coefficients from an n-degree to $(h+2m-1)$ th (note: $h+2m \leq d-1$ to $h+2m-1 \geq d-2$) at the left side are made zero. Therefore, $$T_i \sigma_0 + T_{i-1} \sigma_1 + \ldots + T_{i-m} \sigma_m = 0,$$

with $i = h+m, h+m+1 \ldots h+2m-1$,

From the expression, it is obvious that $\sigma_0 = 1$. By substituting this to the above expression, the following expression can be obtained.

$$T_{i\cdot 1}\sigma_1 + T_{i\cdot 2}\sigma_2 + \ldots + T_{i\cdot m}\sigma_m = T_i,$$

with $i = h+m, h+m+1 \ldots h+2m-1$,

Hence, the matrix expression of the above expression is a linear equation shown in the previously mentioned expression.

In order to perform the correction based on the decoding method for the erasure correction and the erasure plus error correction, the larger number of operations to be executed for the error plus error correction is made larger than that for the error correction. In particular, it is necessary to execute a lot of operations when obtaining the error number m and an error locator polynomial $\sigma(z)$ if only errors exist.

The correcting procedure can be realized by the relevant software and a computer for executing the software. For a product such as a DAT or a D-VCR, an error correcting circuit (referred to as an ECC circuit) to be operated on a microcode is developed for commercial use.

The algorithm for calculating an error number m in the erasure plus error correction will be described below as referring to the drawings. If the erasure plus error correction is executed for the erasure number h and the error number m, the maximum values $h_0$ and $m_0$ are preset. In carrying out the erasure plus error correction, it is necessary to meet the relation of $h+2m \leq d-1$, $h \geq 1$ and $m \geq 1$. Hence, the maximum value $h_0$ of the from number h is d-3 and the maximum value $m_0$ of the error number m is the largest integer which does not exceed $(d-2)/2$. In addition, those values $h_0$ and $m_0$ may be set to smaller values in order not to reduce the erroneous correctability and lower the correcting speed.

The inventors of the present invention know an algorithm of "calculating a value of m", where $m_0 = 2$.

It is determined whether or not the erasure number h is equal to or less than d-5. If $h \leq d-5$, the determinant $|G_{h,2}|$ of the secondary square matrix $G_{h,2}$ is calculated. Then, it is determined if $|G_{h,2}|$ is equal to 0. If $|G_{h,2}|$ is not equal to zero, m=2 is given to the algorithm. If $h > d-5$ or $|G_{h,2}| = 0$, then the determinant $|G_{h,1}|$ of the primary square matrix $G_{h,1}$ is calculated.

In succession, it is determined if $|G_{h,1}|$ is equal to zero. If $|G_{h,1}|$ is not equal to zero, m=1 is given. If $|G_{h,1}| = 0$, m=0 is given, then each determinant of $|G_{h,2}|$ and $|G_{h,1}|$ is calculated.

Now, the known algorithm for "calculation of $|G_{h,m}|$" for executing the calculation of this determinant is described. In this algorithm, there exist steps for determining the state at each value of h in larger order such as $h=3, h=4, \ldots, h=h_0$ and steps for calculations to which the operation goes if yes is given in the former steps, although those steps are not illustrative.

At first, it is determined if the erasure number h is equal to 1. If yes, the calculation of the determinant $|G_{1,m}|$ is done and the operation is terminated. If no, then it is determined if a value of h is equal to 2. If yes, then the determinant of $|G_{2,m}|$ is calculated. Then, the operation is terminated.

If the result is negative both at the above two steps, then it is determined if $h = h_0-1$. If yes, the calculation of the determinant of $|G_{h_0-1,m}|$ is performed and the calculation is terminated. If no, the calculation of the matrix $|G_{h_0,m}|$ is performed, and the calculation is terminated.

As described above, if the erasure plus error correction is executed, the part of the program for "calculation of m" includes a branch to be done on the value of an erasure number h. The previously mentioned expression for obtaining the coefficients $\sigma_1, \sigma_2, \ldots \sigma_m$ of the error locator polynomial $\sigma(z)$ for only the errors need a branch, because it refers to a value of h.

At a present time, in the field of products such as DAT, D-VCR and CD, study continues regarding the improvement of a communication speed and the reduction of a product. The error probability on data reading is made larger. The known ECC circuit basically executes the error correction and the erasure correction. It does not, in principle, perform erasure plus error correction. Hence, it is necessary to improve the error correcting probability by doing erasure plus error correction For executing erasure plus error correction, however, it is necessary to perform many operations, thereby increasing the number of operating steps included in a microcode of the ECC circuit, resulting in making the operating speed slower.

SUMMARY OF THE INVENTION

It is an object of the present invention to provide a Galois field operating circuit which is capable of performing an operation on a Galois field at high speed without greatly increasing a number of gates.

The above-mentioned object of the present invention can be achieved by an operating circuit of a Galois Field for executing an operation of the Galois field efficiently and rapidly includes first operating unit for receiving two elements of a Galois field, for performing an addition or a multiplication of the two elements, and for outputting a first operational result thereof, second operating unit for receiving another two elements of the Galois field, for performing an addition or a multiplication of the another two elements, and for outputting a second operational result thereof, third operating unit connected to both the first operating unit and the second operating unit for performing an addition of the first operational result and the second operational result on the Galois field, and for outputting a third operational result thereof, first selecting unit connected to both the first operating unit and the third operating unit for selecting any one of the first operational result and the third operational result, and for outputting a selected result thereof, second selecting unit connected to both the second operating unit and the third operating unit for selecting any one of the second operational result and the third operational result, and for outputting the selected result thereof, and determining unit connected to the first operating unit and the second operating unit as well as the third operating unit for determining the first operational result and the second operational result as well as the third operational result so as to execute an operation of the Galois field efficiently and rapidly.

The first operating unit is an operating circuit which is adapted to perform an operation of two elements X1, X2 of the Galois filed and to output an operational result X.

The second operating unit is an operating circuit which is adapted to perform an operation of two elements Y1, Y2 of the Galois field and to output an operational result Y.

The third operating unit is an operating circuit which is adapted to execute an addition between the operational result X and the operational result of Y and to output an operational result Z.

The first selecting unit is a two-inputs multiplexer which is adapted to select any one of the operational result X of the operating circuit and the operational result Z of the operating circuit, and to output an operational result A.

The second selecting unit is a two-inputs multiplexer which is adapted to select any one of the operational result Y from the operating circuit and the operational result Z of the operating circuit, and to output an operational result B.

The decision unit is a flag decision circuit which is adapted to receive three of the operational results X, Y, Z to output a zero-flag $X_F$ in case that the operational result X is zero, to output a zero-flag $Y_F$ in case that the operational result Y is zero, and to output a zero-flag $Z_F$ in case that the operational result Z is zero.

The operating circuit is adapted to be used with an error-correcting circuit so that the zero flags $X_F$, $Y_F$, $Z_F$ output from the flag determining circuit are used for branching out a flow of an error-correction from the error-correcting circuit according to an error-correction algorithm.

The second operating unit is further adapted to execute an arithmetic addition of $Y=Y1+Y2$ and an arithmetic subtraction of $Y=Y1-Y2$, wherein the Y1 and Y2 representing elements of the Galois field input to the second operating unit.

The decision unit is arranged that a carry flag $C_F$ is output from the decision unit at a time when the second operating unit generates a carry of most significant bit of the operational result Y in the arithmetic addition or a borrow from an upper digit of the most significant bit of the operational result Y in the arithmetic subtraction.

The decision unit is further arranged that a sign flag $S_F$ is output from the decision unit at a time when the most significant bit of the operational result Y is 1 in the arithmetic addition or the arithmetic subtraction of the second operating unit.

The decision unit is further arranged that an overflow flag $V_F$ is output from the decision unit at a time when overflowing the operational result Y in the arithmetic addition or in the arithmetic subtraction in which the elements Y1 and Y2 of the Galois field represent negative numbers as two's complements.

Advantages of the present invention are such that the Galois field operating circuit is capable of efficiently performing an operation of a Galois field without having to greatly increase the number of gates.

It is another object of the present invention to provide an error correcting circuit which is capable of setting an optimal strategy and efficiently and rapidly correcting data.

The above-mentioned object can be achieved by an error correcting circuit adapted to be used in an operating circuit for Galois Field includes an operation analyzing unit having a first shift register for a serial-to-parallel conversion, the first shift register serving to sequentially store data of each locator and value of errors determined through a Chien search and to convert the stored data into parallel data, a corrected data outputting unit having a second shift register for a parallel-to-serial conversion and connected to the operation analyzing unit, the second shift register serving to read the parallel data when switching a pipeline, to convert the parallel data into serial data, and to output the serial data in an inverted sequence to data train stored in the first shift register for the serial-to-parallel conversion, the operation analyzing unit and the corrected data outputting unit being operated in parallel in such a manner that the correction outputting unit outputs the corrected result by matching the input data train applied into the error correcting circuit with the sequence of data listing.

The operation analyzing unit is arranged to have an operating section, a $\sigma$ (z) Chien search circuit connected to the operating section, a $\omega$ (z) Chien search circuit connected to the operating section and the Chien search circuit, an operating circuit connected to the Chien search circuits, a serial-to-parallel conversion shift register connected to the Chien search circuit, and a serial-to-parallel conversion shift register connected to the operating circuit and the serial-to-parallel conversion shift register.

The corrected data outputting unit is arranged to have a parallel-to-serial conversion shift register connected to the shift register, a parallel-to-serial conversion shift register connected to the serial-to-parallel conversion shift register, an address counter connected to the parallel-to-serial conversion shift register, a corrector, and a selector connected to the parallel-to-serial conversion shift register, the address counter and the corrector.

The operating section serves to perform operations about coefficients $\sigma_0$ to $\sigma_n$ and $\omega_0$ to $\omega_{n-1}$ of an error-locator polynomial $\sigma$ (z) and an error-evaluator polynomial $\omega$ (z) with $$\sigma(z)=\sigma_0+\sigma_1 z+\sigma_2 z^2+\ldots+\sigma_{n-1}z^{n-1}+\sigma_n z^n$$

$$\omega(z)=\omega_0+\omega_1 z+\omega_2 z^2+\ldots+\omega_{n-1}z^{n-1}$$

n representing a number of errors to be corrected.

The $\alpha$ (z) Chien search circuit is adapted to sequentially substitute $\alpha 0$ to $\alpha^{-(n=1)}$ therein.

The operating circuit is so arranged that a formal difference of $\sigma$ $(\alpha^{-x})$ is applied thereto if a value $\sigma$ $(\alpha^{-x})$ in an inverse of an error locator or $\sigma^{-x}$ is made zero.

The $\omega$ (z) Chien search circuit is adapted to apply a value $\omega$ $(\alpha^{-x})$ into the operating circuit i4 in which a size of an error is derived on a formal differential $\sigma'$ $(\alpha^{-x})$ and a vl $\omega$ $(\alpha^{-x})$ at a time when a control signal indicating zero is transmitted to the $\omega$ (z) Chien search circuit.

The serial-to-parallel conversion shift registers are so arranged that by repeating operations of transmitting the control signal indicating zero to the serial-to-parallel shift registers, and applying the location and the value of the error to the serial-to-parallel shift registers as well, the detected error data is stored as parallel data therein.

The parallel-to-serial conversion shift registers are so arranged that the stored parallel data is read by the shift registers at a time when switching a pipeline, and the value is converted in the same data sequence as the data train input to the error correcting circuit.

The corrected data outputting unit is so arranged that the error location is compared with that stored in the address counter, and in case that the error locations are matched, a match signal is sent to the selector and only an error symbol is corrected in the corrector before outputting.

The parallel-to-serial shift registers are shifted by one stage so that it is possible to execute a correction in a process of outputting the input data train without preparing an independent correcting process.

Advantages of the present invention are such that the error correcting circuit may be reduced in size, operated rapidly and adapted to various strategies.

It is another object of the present invention to provide a decoding device for Reed-Solomon code which is capable of correcting an error efficiently if the data is processed at high speed.

The above-mentioned object can be achieved by a decoding device for Reed-Solomon code which is arranged to have a plurality of individual circuits and to perform a decoding operation in a flow-process manner through a pipeline processing, each of the individual circuits corresponding to each of processes, the decoding device being adapted to be used in an operating circuit for Galois Field, the decoding device includes an input unit for operating a syndrome according to an input data and for generating erasure locators from a plurality of deleting flags at a time when erasure an error for correction, a polynomial generating unit connected to the input unit for deriving a coefficient of each degree of a predetermined polynomial according to a result output from the input unit, and a polynomial estimating unit connected to the polynomial generating unit for deriving an error locator and an error value by substituting an element of a Galois field into the predetermined polynomial.

The input unit is adapted to receive a code containing an error and to generate a syndrome according to a predetermined relation, the generated syndrome is sent to the polynomial generating unit, and the input unit starts to generate a syndrome of a next received code.

The polynomial generating unit is adapted to perform an operating process according to a program and to determine a number of errors from the syndrome according to predetermined relations.

The polynomial generating unit is further adapted to derive coefficients of an error locator polynomial, and to derive coefficients of an error evaluator polynomial according to a predetermined relation the syndrome, and so arranged that the error locator polynomial and the error evaluator polynomial derived in the polynomial generating unit are sent to the polynomial estimating unit so as to execute the process repeatedly at a time when the syndrome of the next received code is input to the polynomial generating unit.

The polynomial generating unit is arranged to have syndrome registers, erasure locator registers, data buses, input registers, a first operating circuit, a second operating circuit, an instruction read-only-memory, a program counter, error locator polynomial registers, error evaluator polynomial registers, and reference registers.

The polynomial generating unit is so arranged that the syndrome and the erasure locator number output from the input unit are held in the syndrome register and the erasure locator register, respectively.

The polynomial generating unit is so arranged that the data are selected by an instruction stored in the instruction read-only memory and output to the data buses, the data buses being connected to the input registers of the first operating circuit and the second operating circuit, the data stored in the input registers being processed in the first operating circuit and the data stored in the input registers being processed in the second operating circuit.

The first operating circuit and the second operating circuit provide operating elements, the operating elements enabling to execute an addition and a multiplication on the Galois field according to an instruction, and the operated result being stored in the addresses specified in operating registers according to an instruction, the operating registers being provided in the operating circuits, respectively.

The first operating circuit and the second operating circuit are so arranged that outputs of the operating registers are connected to the data buses, the readout address being determined by an instruction in each independent bus, and a specific data bus in the data buses being used to output each degree coefficient of the error locator polynomial and the error evaluator polynomial and an error number and a reference syndrome.

The first operating circuit and the second operating circuit are further arranged that an address of the instruction read-only memory is given by the program counter, the program counter being branched through the instruction read-only memory and an absolute or relative jump address being given from the instruction read-only memory.

The first operating circuit and the second operating circuit are further arranged that several kinds of correcting algorithms are installed in the instruction read-only memory depending on a correcting mode, a code arrangement, a number of erasure, and an error number obtained by the polynomial generating unit, the correcting algorithm being properly branched for executing a correcting process in a manner to flexibly and rapidly cope with an error condition.

The polynomial evaluator unit is adapted to estimate an error locator polynomial and an error evaluator polynomial therein, and elements of the Galois field being sequentially substituted in an polynomial for obtaining necessary values to be put in a predetermined relation.

The polynomial evaluator unit is so arranged that an error value is derived from a predetermined relation when estimating the error locator polynomial by separating a sum of only odd degree terms from a sum of all degree terms in the predetermined relation.

The polynomial evaluator unit is further arranged that an error locator polynomial is set to be equal to zero and a sum of only even degree terms is made equal to a sum of only odd degree terms at a time when a solution of the error location polynomial is obtained by a Chien search function, thereby a sum of only even odd terms may be used for obtaining same result in place of a sum of only odd degree terms in a predetermined relation.

The polynomial evaluator unit is further arranged that for an error location output from the polynomial evaluator unit, a combination for giving an error locator polynomial to be equal to zero is output as a result of a Chien search, and an estimated result of a predetermined relation at each error location is output as an error value.

The decoding device is so arranged that a number of errors obtained from the polynomial generating unit is sent to the polynomial evaluator unit and determined if the number is equal to a number of solutions of the error locator polynomial obtained by the polynomial evaluator unit for checking a correcting process.

The decoding device is so arranged that in case of non-used syndromes being left at a time when the polynomial generating unit derives an error locator polynomial and an error evaluator polynomial, syndromes not used for decoding a received code are sent from the polynomial generating unit to the polynomial evaluator means so that it is determined if an error location derived from the polynomial evaluator unit matches to a syndrome verified from an error value for checking a correcting process.

The polynomial evaluator unit includes an error locator polynomial evaluator unit, an error location output unit connected to the error locator polynomial evaluator unit, an error value output unit connected to the error locator polynomial evaluator unit and the error location output unit, a syndrome verifying unit connected to the error value output unit, an error number output unit connected to the error value output unit, and a checked result output unit connected to the syndrome verifying unit and the error number output unit.

The polynomial estimating unit is so arranged that when estimating an error locator polynomial, the error locator polynomial estimating unit operates to divide the error locator polynomial into even degree terms and odd degree terms and substitute elements of the Galois field into the even degree terms and the odd degree terms for obtaining a proper value of the polynomial, and when the error locator polynomial estimating unit finds a solution, the error location output unit operates to gate an output of an error location pointer synchronized with the elements of the Galois field to be substituted by unit of a find signal for obtaining an error location, thereby the error value output unit serves to gate an error location pointer by unit of a find signal for obtaining an error value.

The syndrome verifying unit serves to compare a syndrome derived for trial from an error with a verifying syndrome sent from the polynomial generating unit as a check for a corrected result and to determine that a verified result is correct if matched, the error number output unit compares a count of solutions found through the chaining search with an error number sent from the polynomial generating unit and determines that the error number is correct if matched, and the checked result output unit serves to output a logic OR of outputs from the syndrome verifying unit and the error number output unit as a checked result output from the polynomial estimating unit.

.Advantages of the present invention are such that the decoding device enables to rapidly and flexibly adapt to various decoding strategies, and may offer the effect that a superior correcting capability can be realized at a time when correcting an error appearing for recording and reproducing fast compressed data.

It is another object of the present invention to provide a verifying circuit for an error-corrected result which is capable of efficiently doing error correction.

The above-mentioned object can be achieved by a verifying circuit of an error-corrected result for verifying a syndrome with a corrected result given by an error correcting device used for recording and reproducing digital data, the verifying circuit being adapted to be used in an operating circuit for Galois field, the verifying circuit includes operating unit for operating a data train to be input to the error correcting circuit and a syndrome containing an addition of Galois field of an error location according to a predetermined relation, and determining unit connected to the operating unit for determining whether or not the operated result is a specific value.

The verifying circuit is arranged to have a selecting circuit, a first adder served as operating unit connected to the selecting circuit, a second adder connected to the first adder, a flip-flop and a multiplier both connected to the second adder, and an AND circuit served as determining unit connected to the selecting circuit, the second adder and the multiplier.

The selecting circuit is adapted to receive a syndrome used for a verification as an input signal at an input terminal thereof, to receive a synchronous reset signal at a control terminal thereof, the synchronous reset signal being held low only at head data of the data train and to supply the input signal without any change when the control terminal is set at low level and to supply a zero signal when the control terminal is set at high level.

The first adder is adapted to receive an output from the selecting circuit and a data train indicating an error size, and to supply an output to a circuit disposed in the second adder, the flip-flop, and the multiplier.

The verifying circuit is so arranged that when data indicating a last error value is read by the flip-flop, the circuit supplies an output, and it is determined that a correction is proper depending on whether or not a value of a predetermined relation is zero, and a reset signal is input to the AND circuit so as to initialize the flip-flop.

The verifying circuit is so arranged that the verifying circuit generates a syndrome from the data train input to the error correcting circuit and an operation on the Galois field of the error location, and the verifying circuit is adapted to perform an operation of determining whether or not the verified result is zero when a last data at an output of a Chien search is input to the circuit, the determined result indicating whether or not the corrected result is proper.

Advantages of the present invention are such that the verifying circuit can execute the verifying process at a time when deriving an error location and an error value through the Chien search, resulting in reducing the waiting time, thereby performing a correction at high speed.

It is another object of the present invention to provide an error correcting circuit which is capable of efficiently correcting an error with small-scaled circuitry.

The above-mentioned object can be achieved by an error correcting circuit adapted to be used in an operating circuit for Galois field includes first converting unit for receiving first data as parallel data and outputting the first data as serial data, second converting unit for receiving second data as parallel data and outputting the second data as serial data, a counter for outputting third data, determining unit connected to the second converting unit and the counter for receiving the second data output from the second converting unit and the third data output from the counter, for determining whether or not the second data matches to the third data, and for sending a predetermined signal to the first converting unit and the second converting unit according to the determined result, and selecting unit connected to the first converting unit and the determining unit for receiving the first data output from the first converting unit and for outputting the first data received at a time when the predetermined signal output from the determining unit is received.

The error correcting circuit is arranged to have a shift register served as first converting unit, a shift register served as second converting unit, a selecting circuit served as selecting unit connected to the shift register, a comparator served as determined unit connected to the shift register and the selecting circuit, an address counter served as counter unit connected to the comparator, and an adder connected to the selecting circuit.

The error correcting circuit is further arranged that the error location data for the second data corresponding to symbols obtained is stored in the shift register in an order of addresses, and a direction of the addresses are set to locate a head side of the input data to the error correcting circuit to an output side of the shift register.

The error correcting circuit is further arranged that the first data is stored in the shift register in an magnitude order and the address counter operates to count the input data to the error correcting circuit from the head side synchronous with the delayed input data, the count value corresponding to the third data is compared with the output of the shift register in the comparator.

The error correcting circuit is further arranged that if the count value corresponding to the third data is not matched with the output of the shift register in the comparator, a non-match signal is sent to the shift register, the shift register and the selecting circuit in a manner to prohibit data shift in the shift registers and indicate an output of zero in the selecting circuit, and the symbol determined not to be erroneous in the delayed input data train is output to an external.

The error correcting circuit is further arranged that if the count value corresponding to the third data is matched, the comparator sends a match signal corresponding to a predetermined signal to the shift register, the shift register and the selecting circuit, and the selecting circuit outputs data about an error size and the adder corrects the input data, the shift registers being adapted to shift the data by one stage for waiting a next correction.

Advantages of the present invention are such that the error correcting circuit enables to efficiently perform an error correction with a small-scaled circuitry.

It is another object of the present invention to reduce the program of the microcode for executing the erasure plus error correction and improve the processing speed of the erasure plus error correction.

The above-mentioned object can be achieved by an error correcting circuit adapted to be used in an operating circuit for Galois field includes converting unit for receiving first data and second data as parallel data and for outputting the first data and the second data as serial data, respectively, a counter for outputting third data, determining unit connected to the second converting unit and the counter for receiving the second data output from the second converting unit and the third data output from the counter, for determining whether or not the second data matches to the third data, and for sending a predetermined signal to the first converting unit and the second converting unit according to the determined result, a unit for forming delayed input data, operating unit for operating the first data, and selecting unit for selecting one of the delayed input data and the signal output from the operating unit.

The selecting unit is provided at a last stage so as to select an added result of the delayed input data and the output of the converting unit in response to a control signal before outputting.

The selecting unit is adapted to receive the input data train and an output of the adder for constantly adding the output of the converting unit to the input data train.

The operating unit is adapted to send the error location data to the second converting unit, and the determining unit compares an address value counted by the counter with the error location data sent from the converting unit.

The error correcting circuit is so arranged that when the address value counted by the counter is not matched with the error location data sent from the converting unit, and the determining unit sends a non-match signal to the converting unit and the selecting unit so as to indicate a prohibit of the data shift to the converting means and a prohibit of correction in the selecting unit, and a symbol determined not to be erroneous in the delayed input data train is output to an external.

The error correcting circuit further includes an adder, and the error correcting circuit is so arranged that when the address value counted by the counter is matched with the error location data sent from the converting unit in the determining unit, the determining unit sends a match signal to the converting unit and the selecting unit, and the selecting unit is adapted to select an output of the adder for constantly adding the input data train to the output of the converting unit for executing a correction of the input data.

The error correcting circuit is so arranged that the converting unit is adapted to shift the data by one stage and output next error location data and error value data for waiting a correction of the next error value data.

The error correcting circuit is adapted to utilize a method for decoding Reed-Solomon in decoding Reed-Solomon codes of the minimum distance d for solving n-stage simultaneous linear equations of $$S_k = \sum_{i=1}^{n} X_i^k E_i$$

where k=0, 1 . . . . . d-2, and for deriving an error number m as largest integer allowing m-degree square matrix $G_m'$ to be non-singular independent of a number h of erasure, with the m-degree square matrix $G_m'$ being represented as $$G_m' = \begin{pmatrix} T_{d-m-2} & T_{d-m-3} & \cdots & T_{d-2m-1} \\ T_{d-m-1} & T_{d-m-2} & \cdots & T_{d-2m} \\ \cdot & \cdot & & \cdot \\ \cdot & \cdot & & \cdot \\ \cdot & \cdot & & \cdot \\ T_{d-3} & T_{d-4} & \cdots & T_{d-m-2} \end{pmatrix}$$

where $$\left\{\prod_{i=1}^{h}(1 - X_i z)\right\}\left(\sum_{i=0}^{d-2} s_i z^i\right) = \sum_{i=0}^{d-2} T_i z^i \pmod{z^{d-1}}$$

with $X_i$ denoting a i-th erasure location ($1 \leq i \leq h$) or an (i-h)th error value ($h+1 < i < n$), $E_i$ denoting an error value of an i-th erasure ($1 \leq i \leq h$) or an error value of an (i-h) th error, and n=h+m denotes a total number of erasures and errors.

The error correcting circuit includes a data bus, an operating unit, a group of working registers, a read-only memory for storing a microcode, a random-access memory for storing a transmitted word or a received word, a readout register, a write register, and a control circuit for operating to sequentially read a microcode from the read-only memory in a manner to control an operation of the error correcting circuit.

The error correcting circuit is adapted to read out a received word from the random-access memory, to correct the received word, and to write the corrected and received word in the random-access memory for decoding the corrected and received word.

The error correcting circuit is so arranged that an correction for the received word is executed to perform necessary operations such as additions and multiplications through the operating unit as storing an intermediate result of an operation in the group of working registers for deriving an error location and an error value.

The error correcting circuit is further arranged that the received word is read out through the readout register and the received word is corrected through the write register.

The error correcting circuit is so arranged that when the erasure plus error correction is performed in the error correcting circuit, an error number m can be obtained as largest integer allowing an m-degree square matrix $G_m'$ to be non-singular independent of an erasure number h, the m-degree square matrix $G_m'$ being represented as $$G_m' = \begin{pmatrix} T_{d-m-2} & T_{d-m-3} & \cdots & T_{d-2m-1} \\ T_{d-m-1} & T_{d-m-2} & \cdots & T_{d-2m} \\ \cdot & \cdot & & \cdot \\ \cdot & \cdot & & \cdot \\ \cdot & \cdot & & \cdot \\ T_{d-3} & T_{d-4} & \cdots & T_{d-m-2} \end{pmatrix}$$

where $$\left\{\prod_{i=1}^{h}(1-X_i z)z\right\}\left(\sum_{i=0}^{d-2}s_i z^i\right)\left(\sum_{i=0}^{d-2}T_i z^i\right) \pmod{z^{d-1}}$$

with $h+2m \leq d-1$ and $h \geq 1$, thereby, coefficients $\sigma_1, \sigma_2, \ldots \sigma_m$ of an error locator polynomial $\sigma(z)$ for only errors are obtained by the following linear equation of $$G_m' \begin{pmatrix} \sigma_1 \\ \sigma_2 \\ \cdot \\ \cdot \\ \cdot \\ \sigma_m \end{pmatrix} = \begin{pmatrix} T_{d-m-1} \\ T_{d-m} \\ \cdot \\ \cdot \\ \cdot \\ T_{d-2} \end{pmatrix},$$

and resulting in that coefficients from a (d-m-l) th (note:$h+2m \leq d-1$ to $d-m-1 \leq h+m=n \geq 1$) degree to a (d-2) th degree on a left side are made zero so that, $$T_i \sigma_0 + T_{i-1} \sigma_1 + \ldots + T_{i-m} \sigma_m = T_i,$$

where i=d-m-1, d-m ...... d-2, and since $\sigma_0 = 1$ is given, following simultaneous linear equations are established, $$T_{i-1}\sigma_1 + T_{i-2}\sigma_2 + \ldots + T_{i-m}\sigma_m = T_i,$$

where i=d-m-1, d-m ..., d-2, as a matrix representation of these equations corresponds to the expression. Advantages of the present invention are such that it makes possible to reduce a size of the program and improve the processing speed for an erasure plus error correction, and further improve an error correcting probability by performing the erasure plus error correction without increasing an over all size of the ECC.

Further objects and advantages of the present invention will be apparent from the following description of the preferred embodiments of the invention as illustrated in the accompanying drawings.

DESCRIPTION OF THE PREFERRED EMBODIMENTS

Referring to the accompanying drawings, embodiments of the present inventions will be described in detail.

Figure 1:
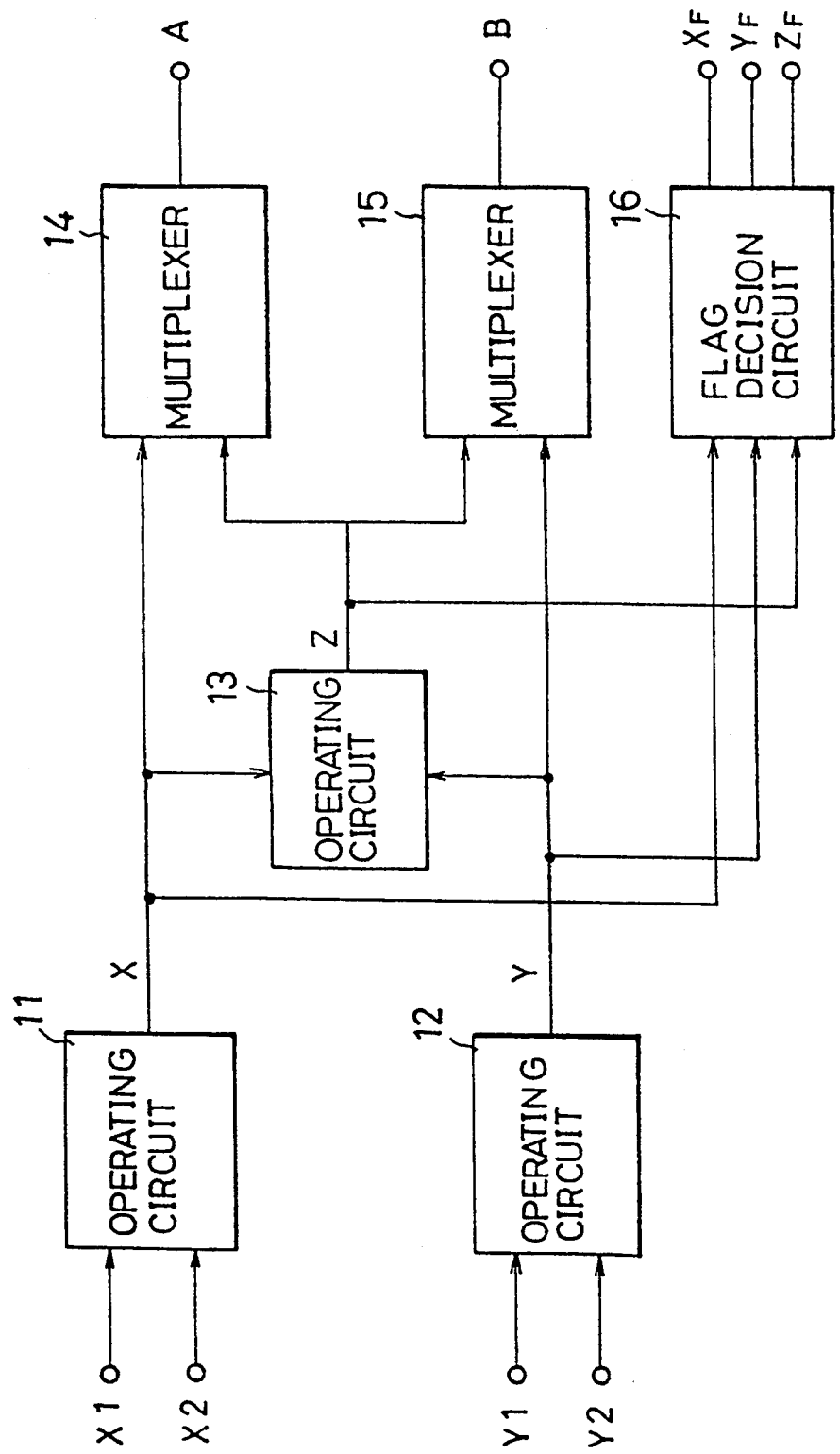
FIG. 1 is a block diagram showing an arrangement of a Galois field operating circuit according to a first embodiment of the invention.

FIG. 1 shows an arrangement of a Galois field operating circuit according to a first embodiment of the present invention.

The Galois field operating circuit shown in FIG. 1 is arranged to have a first operating circuit 11, a second operating circuit 12, a third operating circuit 13, the operating circuit 13 connected to the operating circuit 11 and the operating circuit 12, a two-input multiplexer 14 connected to the operating circuit 11 and the operating circuit 13, a two-input multiplexer 15 connected to the operating circuit 12 and the operating circuit 13 being, and a flag determining circuit 16 connected to the operating circuits 11, 12 and 13.

Next, the operation of each component in FIG. 1 will be described below.

The operating circuit 11 serves to perform an operation of the elements X1 and X2 of the Galois field being input thereto and to output an operational result X. The operating circuit 12 serves to perform an operation of the elements Y1 and Y2 of the Galois field being input thereto and to output an operational result Y. The operating circuit 13 serves to perform an addition of the operational result X and the operational result Y and to output the added result Z.

The two-input multiplexer 14 serves to select one of the operational result X sent from the operating circuit 11 and the operational result Z sent from the operating circuit 18 and output the selected result A.

The two-input multiplexer 15 serves to select one of the operational result Y sent from the operating circuit 12 and the operational result Z sent from the operating circuit 13 and to output the selected result B.

The flag determining circuit 18 serves to accept three operational results X, Y and Z, to output a zero flag $X_F$ if the operational result X is zero, to output a zero flag $Y_F$ if the operational result Y is zero, and to output a zero flag $Z_F$ if the operational result Z is zero.

Two of these three operational results X, Y and Z are stored in the internal register or external.

The complicated calculation can be executed by storing the intermediate results in the internal register.

The multiplication to be executed in the operating circuit 11 or 12 is performed by a read-only memory (ROM) or a gate.

The addition to be executed in the operating circuit 11, 12 or 18 is performed by an exclusive OR gate.

The zero flags $X_F$, $Y_F$ and $Z_F$ output from the flag determining circuit 16 are used by the error correcting circuit so that the error correcting circuit may branch an error correcting flow in accordance with an error correcting algorithm.

For example, assuming that the flow of correction is branched depending on whether or not the two-dimensional matrix ($a_{ij}$) is regular, the algebra of matrices is executed as follows;

$$Z = a_{11} \times a_{22} + a_{21} \times a_{12}$$

If the operation of the matrices results in feeding a value of zero, the zero flag $Z_F$ is output. Based on the zero flag $Z_F$, the error correcting circuit enables to branch the flow of error correction.

The Galois field operating circuit according to this embodiment facilitates obtaining a sum of the four elements P, Q, R and S on the Galois field by performing just one expression of $$Z = P + Q + R + S$$

In order to obtain a product Z of the four elements P, Q, R and S on the Galois field, just two operations are required to be executed as follows;

$$A = P \times Q, B = R \times S$$

$$Z = A \times B$$

wherein A and B denote intermediate results stored in an internal register. The first-stage calculation is executed to output two intermediate results A and B. Such a calculation is not implemented in the known Galois field operating circuit.

The operating circuits 11 and 12 included in this embodiment are capable of performing a multiplication as well as an addition on the Galois field. The number of gates provided in an adder is relatively smaller than the number of gates provided in a multiplier. Therefore as a whole, the Galois field operating circuit according to this embodiment does not provide a far larger number of gates than the known Galois field operating circuit.

Figure 2:
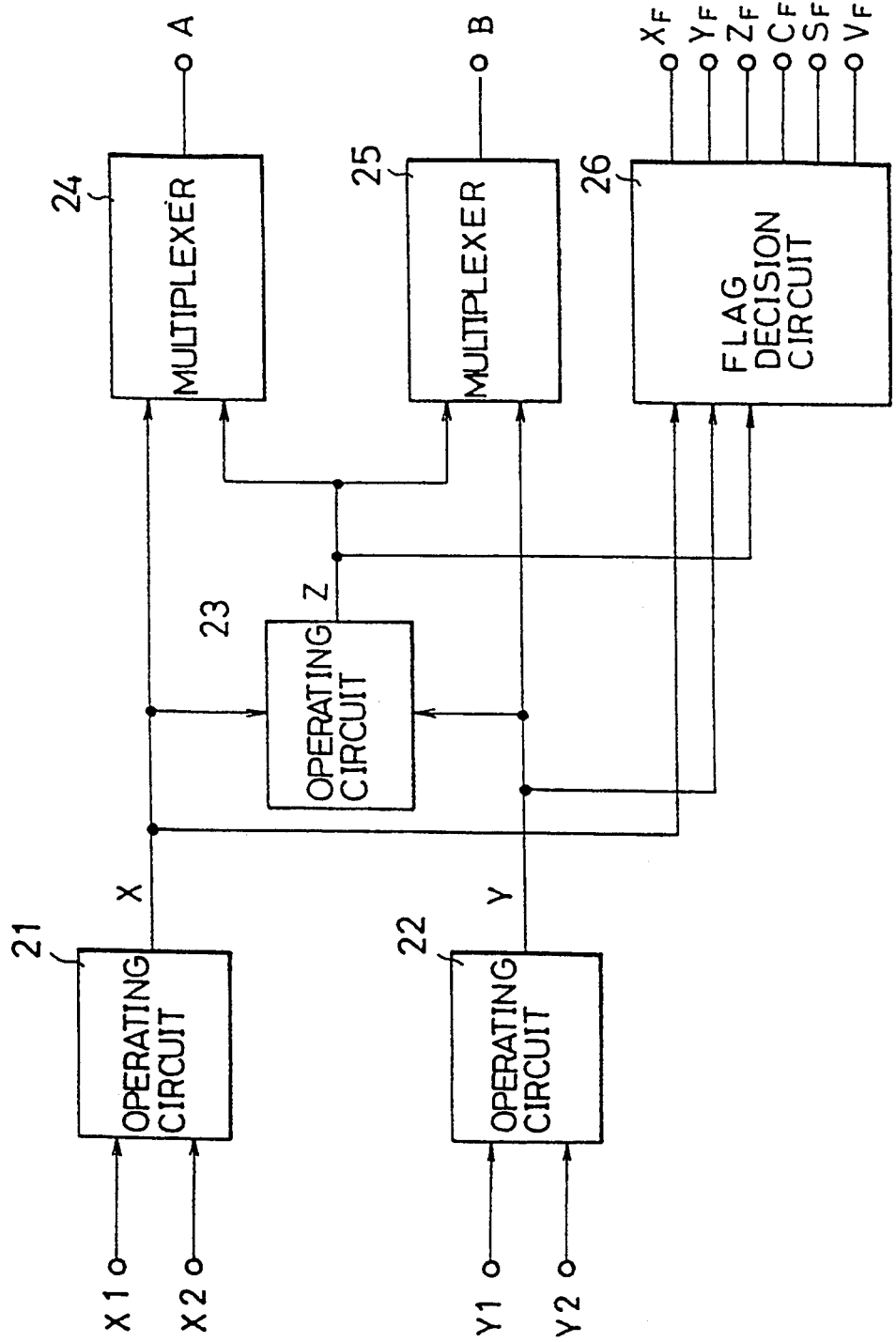
FIG. 2 is a block diagram showing an arrangement of a Galois field operating circuit according to a second embodiment of the invention.

FIG. 2 shows an arrangement of a Galois field operating circuit according to a second embodiment of the invention.

The Galois Field operating circuit shown in FIG. 2 is arranged to have a first operating circuit 21, a second operating circuit 22, a third operating circuit 23, the operating circuit 23 being connected to the first and the second operating circuits 21 and 22, a two-input multiplexer 24 connected to the operating circuits 21 and 23, a two-input multiplexer 25 connected to the operating circuits 22 and 23, and a flag decision circuit 26 connected to the operating circuits 21, 22 and 23.

Next, the operation of the Galois field operating circuit shown in FIG. 2 will be described.

The Galois field operating circuit shown in FIG. 2 is arranged to have the operating circuit 22 which can perform an addition of Y=Y1+Y2 and a multiplication of Y=Y1×Y2 on the Galois field as well as an arithmetic addition of Y=Y1+Y2 and an arithmetic subtraction of Y=Y1−Y2.

The flag decision circuit 26 enables to output zero flags $X_F$, $Y_F$ and $Z_F$ as well as a carry flag $C_F$, a sign flag $S_F$, and an overflow flag $V_F$.

When the operating circuit 22 generates a carry of the most significant bit of the operational result Y in the arithmetic addition or a borrow from an upper digit of the most significant bit of the operational result Y in the arithmetic subtraction, the carry flag $C_F$ is output from the operating circuit 22. When the most significant bit of the operational result Y is 1 in the arithmetic addition or subtraction of the operating circuit 22, the sign flag $S_F$ is output. When overflowing the operational result Y in the arithmetic addition or subtraction in which the elements Y1 and Y2 of the Galois field input to the operating circuit 22 represent the negative numbers as two's complements, the overflow flag $V_F$ is output.

The error correcting circuit operates to branch the flow of error correction depending on the number of parity symbols and the number of erasure flags. This makes it easier to implement the error correcting circuit having the Galois field operating circuit simply by providing necessary arithmetic adding and subtracting functions.

For example, to check whether or not the number P of parity symbols is larger than 6, the operating circuit 22 performs an arithmetic subtraction of Y=P−7 and if no carry flag $C_F$ is output, it is determined that the number P of parity symbols is larger than 6. At a time, the operating circuit 21 also enables to perform an operation of a Galois field.

Figure 3:
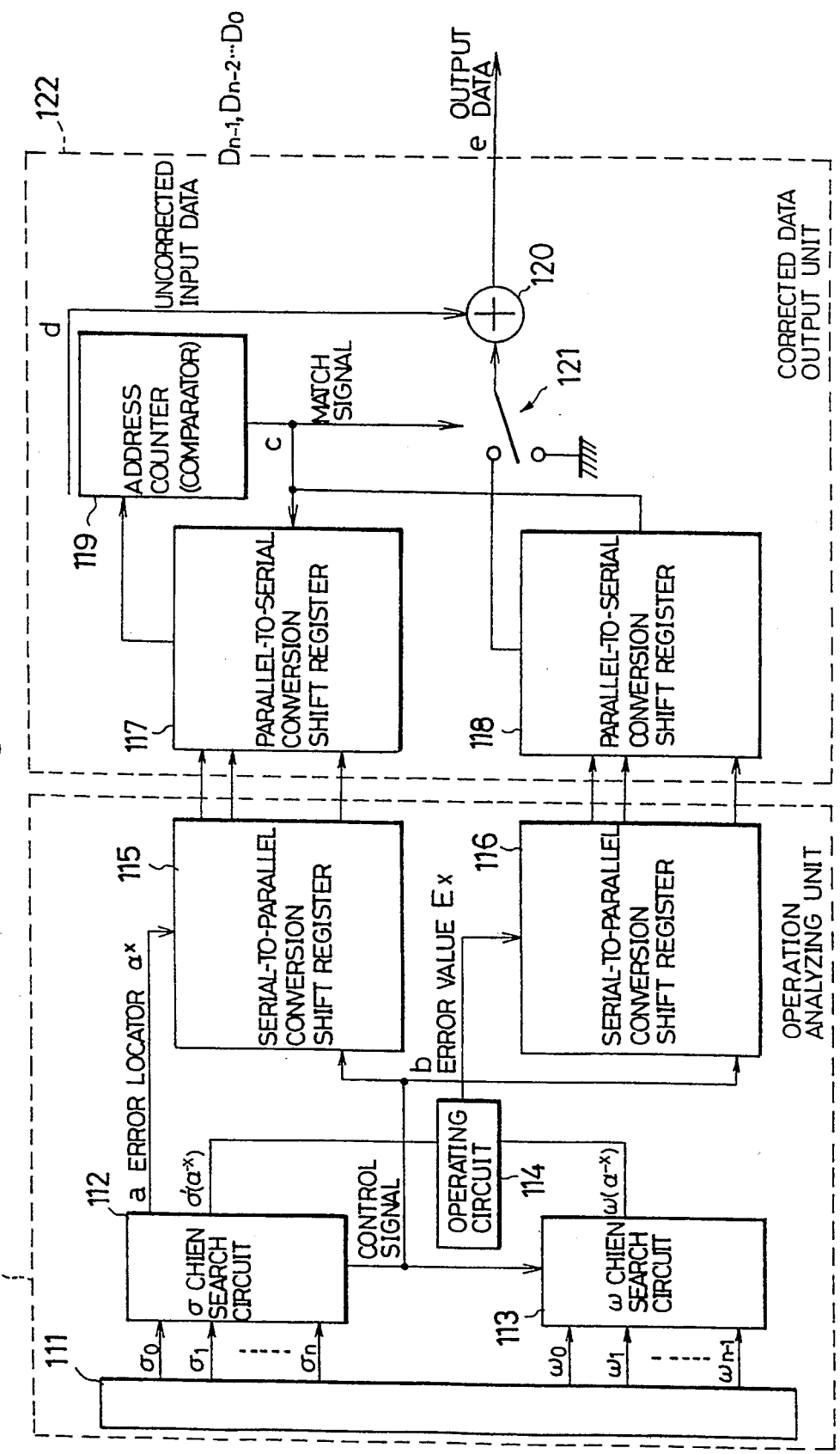
FIG. 3 is a block diagram showing an arrangement of an error correcting circuit according to an embodiment of the invention.

FIG. 3 shows an arrangement of an error correcting circuit according to an embodiment of the present invention.

The error correcting circuit shown in FIG. 3 provides an operation analyzing unit 110 and a corrected data output unit 122. The operation analyzing unit 110 is arranged to have an operating section 111, a $\sigma$ (z) Chien search circuit 112 (referred to as a Chien search circuit 112) connected to the operating section 111, a $\omega$ (z) Chien search circuit (referred to as a Chien search circuit 118) connected to the operating section 111 and the Chien search circuit 112, an operating circuit 114 connected to the Chien search circuits 112 and 118, a serial-to-parallel conversion shift register (referred to as a shift register 115) connected to the Chien search circuit 112, and a serial-to-parallel conversion shift register 116 (referred to as shift register 116) connected to the operating circuit 114 and the shift register 115. The corrected data output unit 122 is arranged to have a parallel-to-serial conversion shift register 117 (referred to as a shift register 117) connected to the shift register 115, a parallel-to-serial conversion shift register 118 (referred to as a shift register 118) connected to the shift register 118, an address counter 119 connected to the shift register 117, a corrector 120, and a selector 121 connected to the shift register 118, the address counter 119 and the corrector 120.

Next, the description will be oriented to an operation of the error correcting circuit shown in FIG. 3.

At first, the operating section 111 serves to perform operations about coefficients $\sigma_0$ to $\sigma_n$ and $\omega_0$ to $\omega_{n-1}$ of an error-locator polynomial $\sigma$ (z) and an error-evaluator polynomial $\omega$ (z) indicated below:

$$\sigma(z) = \sigma_0 + \sigma_1 + \sigma_2 z^2 + \ldots$$
$$+ \sigma_{n-1} z^{n-1} + \sigma_n z^n \omega(z) = \omega_0 + \omega_1 z + \omega_2 z^2 + \ldots$$
$$+ \omega_{n-1} z^{n-1}$$

where n is a number of errors to be corrected.

In the Chien search circuit 112, $\alpha^0$ to $\alpha$-(n-1) are sequentially substituted therein. For example, if the value $\sigma$ ($\alpha^{-x}$) in an inverse of an error locator or $\alpha^{-x}$ is made zero, a formal differential of $\sigma$ ($\alpha^{-x}$) is applied into the operating circuit 114. At a time, a control signal indicating zero is transmitted to the Chien search circuit 113. Then, a value $\omega$ ($\alpha^{-x}$) is applied into the operating circuit 114 in which the value of an error is derived on the formal differential $\sigma'$ ($\alpha^{-x}$) and the value $\omega$ ($\alpha^{-x}$).

Further, the above control signal is transmitted to the shift registers 115 and 116 at a time. The locator and the value of the error at that time are applied to the shift registers as well. By repeating this operation, the detected error data is stored as parallel data.

The stored parallel data is read by the shift registers 117 and 118 when pipelines are switched. The value is converted in the same data sequence as the data train input to the error correcting circuit. The error locator is compared with that stored in the address counter 119. If matched, the match signal is sent to the selector 121. Only the error symbol is corrected in the corrector 120 before outputting. Then, the shift registers 117 and 118 are shifted by one stage. Hence, it is possible to execute a correction in the process of outputting the input data train without preparing an independent correcting process.

Figure 4:
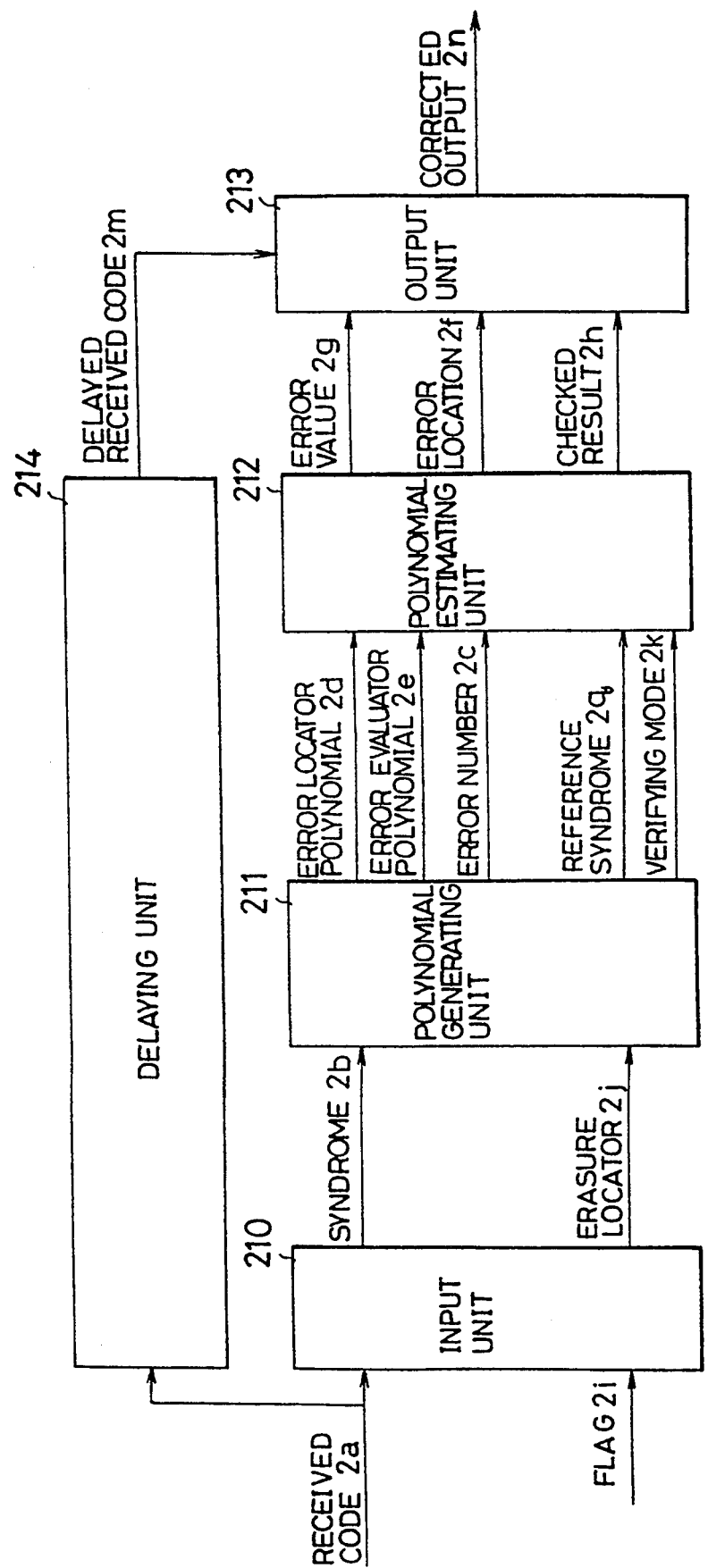
FIG. 4 is a block diagram showing an arrangement of a decoding device for Reed-Solomon code according to an embodiment of the present invention.

FIG. 4 is a block diagram showing an arrangement of a Reed-Solomon decoding circuit according to the embodiment of the invention.

The Reed-Solomon decoding circuit shown in FIG. 4 is arranged to have an input unit 210, a polynomial generating unit 211, a polynomial estimating unit 212, an output unit 218 and delaying unit 214.

Before describing the operation of the Reed-Solomon decoding device shown in FIG. 4, the description will be oriented to an error correction and a correction for erasure in the field of decoding the Reed-Solomon code.

At first, the description will be directed to the error correction.

The error correction is executed to generate the predetermined polynomials, an error locator polynomial $\sigma$ (z) and an error evaluator polynomial $\omega$ (z) from the syndromes substitute the elements of the Galois field to these polynomials for deriving an error location and an error value.

From the received code containing an error, (n-k) syndrome $S_i$ is generated according to the following expression;

$$S_i = \sum_{j=0}^{n-1} Y_j \alpha^{ij} \quad (i = 0, \ldots, n - k - 1) \qquad \text{[Expression 1]}$$

where $Y_j$ denotes each symbol of the received code and $\alpha$ denotes a source element of a Galois field.

The error location polynomial $\sigma$ (z) is defined as follows;

$$\sigma(z) = \prod_{i=1}^{p} (1 - X_i z) = \sigma_0 + \sigma_1 z + \sigma_2 z^2 + \ldots + \sigma_p z^p \qquad \text{[Expression 2]}$$

where p denotes a number of errors contained in a received signal, $X_i$ denotes an error locator which has a value uniquely standing for a location of an error in the code example, if $Y_j$ (j=0 to n-1) is erroneous, locator can be represented by $\alpha^j$ The following relation is established between the syndromes $S_0$ to $S_{2p-1}$ and the coefficients of the error locator polynomial.

$$\sigma_0 = 1$$

[Expression 3]

[Expression 4]

$$\begin{pmatrix} S_{p-1} & S_{p-2} & \ldots & S_0 \\ S_p & S_{p-1} & \ldots & S_1 \\ S_{p+1} & S_p & \ldots & S_2 \\ \cdot & \cdot & & \cdot \\ \cdot & \cdot & & \cdot \\ \cdot & \cdot & & \cdot \\ S_{2p-2} & S_{2p-3} & \ldots & S_{p-1} \end{pmatrix} \begin{pmatrix} \sigma_1 \\ \sigma_2 \\ \sigma_3 \\ \cdot \\ \cdot \\ \cdot \\ \sigma_p \end{pmatrix} = \begin{pmatrix} S_p \\ S_{p+1} \\ S_{p+2} \\ \cdot \\ \cdot \\ \cdot \\ S_{2p-1} \end{pmatrix}$$

The expression 4 is solved into;

$$\sigma_1 = \begin{vmatrix} S_p & S_{p-2} & \cdots & S_0 \\ S_{p+1} & S_{p-1} & \cdots & S_1 \\ S_{p+2} & S_p & \cdots & S_2 \\ \cdot & \cdot & & \cdot \\ \cdot & \cdot & & \cdot \\ \cdot & \cdot & & \cdot \\ S_{2p-1} & S_{2p-3} & \cdots & S_{p-1} \end{vmatrix} / M_p$$

[Expression 5]

$$\sigma_2 = \begin{vmatrix} S_{p-1} & S_p & \cdots & S_0 \\ S_p & S_{p+1} & \cdots & S_1 \\ S_{p+1} & S_{p+2} & \cdots & S_2 \\ \cdot & \cdot & & \cdot \\ \cdot & \cdot & & \cdot \\ \cdot & \cdot & & \cdot \\ S_{2p-2} & S_{2p-1} & \cdots & S_{p-1} \end{vmatrix} / M_p$$

[Expression 6]

$$\sigma_p = \begin{vmatrix} S_{p-1} & S_{p-2} & \cdots & S_p \\ S_p & S_{p-1} & \cdots & S_{p+1} \\ S_{p+1} & S_p & \cdots & S_{p+2} \\ \cdot & \cdot & & \cdot \\ \cdot & \cdot & & \cdot \\ \cdot & \cdot & & \cdot \\ S_{2p-2} & S_{2p-3} & \cdots & S_{2p-1} \end{vmatrix} / M_p$$

[Expression 7]

where $M_p$ can be represented by the following expression.

$$M_p = \begin{vmatrix} S_{p-1} & S_{p-2} & \cdots & S_0 \\ S_p & S_{p-1} & \cdots & S_1 \\ S_{p+1} & S_p & \cdots & S_2 \\ \cdot & \cdot & & \cdot \\ \cdot & \cdot & & \cdot \\ \cdot & \cdot & & \cdot \\ S_{2p-2} & S_{2p-3} & \cdots & S_{p-1} \end{vmatrix}$$

[Expression 8]

If the number of errors is p-1 or less, the expression 8 is made zero. Hence, the number of errors is determined as the largest value of p which gives the solution of the expression 8 for any value except zero.

From the syndromes $S_0$ to $S_{2p-1}$, the syndrome polynomial S(z) is defined as follows.

$$S(z) = S_{2p-1}z^{2p-1} + S_{2p-2}z^{2p-2} + \ldots + S_2 z^2 + S_1 z + S_0$$

[Expression 9]

The error evaluator polynomial $\omega$ (z) can be generated by multiplying the polynomials indicated below.

$$\omega(z) = \sigma(z)S(z)$$

[Expression 10]

When deriving an error location, the method referred to a Chien search is executed to substitute the elements of the Galois field into the expression 2 in sequence for obtaining a solution z $(=X_i^{-1})$ which gives the error locator polynomial $\sigma$ (z)=0.

In a case that the number of errors exceeds the range of correction, the degree of the error locator polynomial may be different from the number of solutions derived through the effect of the chaining search function. By comparing the number of errors derived by the polynomial generating unit with the number of solutions derived through the Chien search function, therefore, it is possible to detect the erroneous correction.

In order to obtain an erroneous value, by using a formal differential $\sigma'$ (z) of the error locator polynomial, it may be represented as follows;

$$E_i = \omega(X_i^{-1}) / \{X_i^{-1} \sigma'(X_i^{-1})\}$$

[Expression 11]

$\sigma'(z)$ is made equal to $\sigma_{odd}(z)/z$ which is a sum of odd degree terms of $\sigma$ (z).

It may be represented as follows;

$$E_i = \omega(X_i^{-1}) / \sigma_{odd}(X_i^{-1})$$

[Expression 12]

where a value of $\sigma_{odd}(X_i^{-1})$ has been already obtained when solution was obtained by the Chien search function. Hence, estimating $\omega$ (z) at a time when the Chien search is executed, it is possible to efficiently derive an erroneous value.

When deriving a coefficient of an error locator polynomial, the following expression may be used in place of the expressions 5 to 8 for performing the similar correction;

$$\sigma_0 = \begin{vmatrix} S_{p-1} & S_{p-2} & \cdots & S_0 \\ S_p & S_{p-1} & \cdots & S_1 \\ S_{p+1} & S_p & \cdots & S_2 \\ \cdot & \cdot & & \cdot \\ \cdot & \cdot & & \cdot \\ \cdot & \cdot & & \cdot \\ S_{2p-2} & S_{2p-3} & \cdots & S_{p-1} \end{vmatrix}$$

[Expression 13]

$$\sigma_1 = \begin{vmatrix} S_p & S_{p-2} & \cdots & S_0 \\ S_{p+1} & S_{p-1} & \cdots & S_1 \\ S_{p+2} & S_p & \cdots & S_2 \\ \cdot & \cdot & & \cdot \\ \cdot & \cdot & & \cdot \\ \cdot & \cdot & & \cdot \\ S_{2p-1} & S_{2p-3} & \cdots & S_{p-1} \end{vmatrix}$$

[Expression 14]

$$\sigma_2 = \begin{vmatrix} S_{p-1} & S_p & \cdots & S_0 \\ S_p & S_{p+1} & \cdots & S_1 \\ S_{p+1} & S_{p+2} & \cdots & S_2 \\ \cdot & \cdot & & \cdot \\ \cdot & \cdot & & \cdot \\ \cdot & \cdot & & \cdot \\ S_{2p-2} & S_{2p-1} & \cdots & S_{p-1} \end{vmatrix}$$

[Expression 15]

-continued $$\sigma_p = \begin{vmatrix} S_{p-1} & S_{p-2} & \cdots & S_p \\ S_p & S_{p-1} & \cdots & S_{p+1} \\ S_{p+1} & S_p & \cdots & S_{p+2} \\ \cdot & \cdot & & \cdot \\ \cdot & \cdot & & \cdot \\ \cdot & \cdot & & \cdot \\ S_{2p-2} & S_{2p-3} & \cdots & S_{2p-1} \end{vmatrix}$$ [Expression 16]

Those expressions do not require a division on a Galois field. This results in reducing the amount of operating processes and eliminating a division from the Galois field operating circuit, thereby simplifying the arrangement of the circuit.

In the case of correcting an erasure, the location of an error on the received codes has been known in advance. Hence, $X_i$ in the expression 2 is known. Without generating an error locator polynomial, it is possible to derive an error location and an error value. As discussed in the embodiment indicated below, the present invention is arranged to use the same process to be executed after the Chien search both for the error correction and correction for an erasure and to place the process on the dedicated hardware for making the process faster.

In order to correct an erasure, it is necessary to take the steps of generating a syndrome, substituting a value of $X_i$ in the expression 2 and deriving the error locator polynomial, and deriving an error evaluator polynomial according to the expression 10. The number of errors is equal to the number of erasure. Hence, the later procedure for correcting an erasure is identical to the procedure for correcting an error.

Next, the description will be oriented to an operation of a decoding device for Reed-Solomon code shown in FIG. 4.

In correcting an error, a received code containing an error is applied into the input unit 210.

The input unit 210 generates (n-k) syndromes $S_0$ to $S_{n-k-1}$ based on the expression 1. The generated syndrome 2b is sent to the polynomial generating unit 211. Then, the input unit 210 starts to generate the syndrome 2b of the next received code 2a.

The polynomial generating unit 211 performs an operating process according to a program and determines the number 2c of errors from the syndrome 2b based on the expressions 5 to 8, derives the coefficients ($\sigma_0$ to $\sigma_p$) of the error locator polynomial 2d, and derives the coefficients ($\omega_0$ to $\omega_{p-1}$) of the error evaluator polynomial 2e based on the expression 10 from the syndrome 2b.

The error locator polynomial 2b and the error evaluator polynomial 2e derived in the polynomial generating unit 211 are sent to the polynomial estimating unit 212.

When the syndrome 2b of the next received code 2a is input to the polynomial generating unit 211, the polynomial generating unit 211 repeats the above process again.

When deriving the coefficients ($\sigma_0$ to $\sigma_p$) of the error locator polynomial 2d, in place of the expressions 5 to 8 the expressions 13 to 16 may be used for the same correction. Further, those expressions do not require a division on the. Galois field. Hence, the arrangement of the operating circuit included in the polynomial generating unit 211 is made simpler.

The polynomial estimating unit 212 operates to estimate the error locator polynomial 2d and the error estimating polynomial 2e in the polynomial estimating circuit (not shown)

In the polynomial estimating circuit, the elements ($\alpha^0$, $\alpha^{-1}$, $\alpha^{-2}$, $\alpha^{-3}$, ... $\alpha^{-(n-1)}$) of the Galois field are sequentially substituted in the polynomial for obtaining the necessary values to be put in the expression. When estimating the error locator polynomial 2d, by separating a sum ($\sigma_{odd}$) of only odd degree terms from a sum of all the degree terms in the expression 2, it is possible to obtain an error value from the expression 12.

When the solution of the error locator polynomial 2d is obtained by the Chien search function, the error locator polynomial $\sigma(z)=0$ is established. A sum of only even degree terms ($\sigma_{even}$) is made equal to a sum $\sigma_{odd}$ of only odd degree terms. Hence, in place of the sum $\sigma_{odd}$ of only the odd degree terms in the expression 12, the sum $\sigma_{even}$ of only the even odd terms may be used for obtaining the same result.

For the error location 2f output from the polynomial estimating unit 212, a combination of z for giving the error locator polynomial $\sigma(z)=0$ is output as a result of the Chien search. As an error value 2g, the estimated result of the expression 12 at each error location is output.

As one method for checking the correcting process, the number 2c of errors obtained from the polynomial generating unit 211 is sent to the polynomial estimating unit 212. It is determined if the number 2c is equal to the number 2d of solutions of the error locator polynomial 2d obtained by the polynomial estimating unit 212 for the purpose of checking the correcting process.

As another method for checking the correcting process, the method may be used when non-used syndromes are left when the polynomial generating unit 211 derives the error locator polynomial 2d and the error evaluator polynomial 2e. In this method, according to the code arrangement and the error condition, syndromes q($S_{chk}$) which are not used for decoding the received code 2a are sent from the polynomial generating unit 211 to the polynomial estimating unit 212 so that it is determined if the error location 2f derived from the polynomial estimating unit 212 matches to the syndrome 2b' verified from the error value 2g for the purpose of checking the correcting process.

The output unit 213 operates to add an error value 2g to symbol corresponding to the error location 2f derived by the polynomial estimating unit 212 of the received code 2m delayed by a time taken in decoding for executing the correcting process.

When the checked result 2h in the polynomial estimating unit 212 indicates an erroneous correction, an uncorrectable flag (not shown) is output. No correction should be done.

In a case of correcting an erasure, the received code a and the erasure flag 2i are input to the input unit 210.

Like the error correction, the input unit 210 operates to generate (n-k) syndromes 2b ($S_0$ to $S_{n-k-l}$) based on the expression 1 and generate the erasure locator 2j from the locations of the erasure flags 2i in the code and then to send them to the polynomial generating unit 211.

The polynomial generating unit 211 performs an operating process according to the program for correcting a drop code, derives coefficients ($\sigma_0$ to $\sigma_p$) of the error locator polynomial 2d based on the expression 2 from the number 2j the erasure locator, and derives coefficients ($\omega_0$ to $\omega_{p-1}$) of the error evaluator polynomial 2e based on the expression 10 from the error locator polynomial 2d and the syndrome 2b, like the error correction.

The error locator polynomial 2d and the error evaluator polynomial 2e derived from the polynomial generating unit 211 are sent to the polynomial estimating unit 212.

The later process is identical to the corresponding process of the error correction. Hence, the description about the later process for correcting a drop code is left out.

Figure 5:
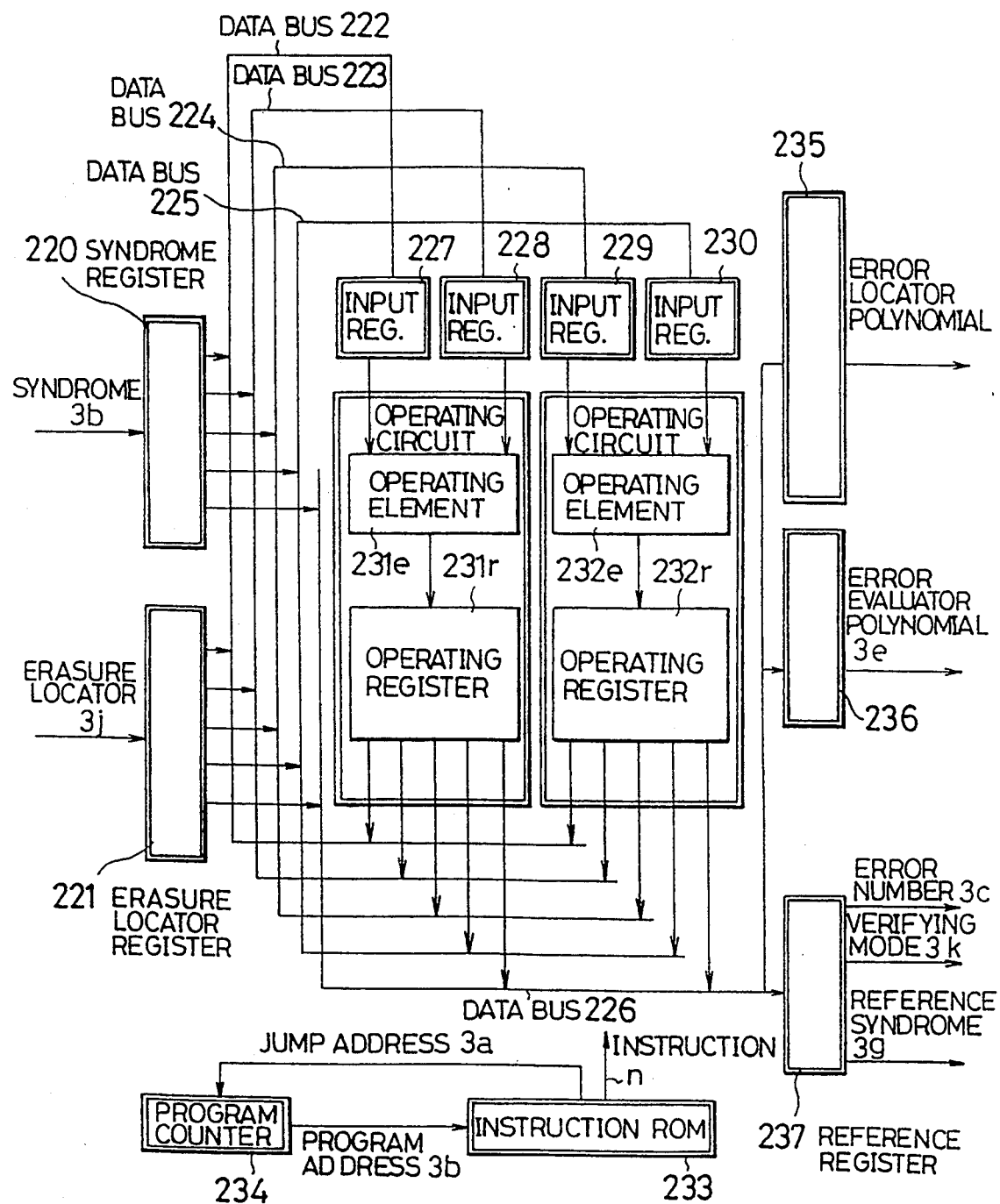
FIG. 5 is a block diagram showing an arrangement of a polynomial generating unit included in the decoding device shown in FIG. 4.

FIG. 5 shows an arrangement of the polynomial generating unit 211 shown in FIG. 4.

The polynomial generating unit 211 shown in FIG. 5 is arranged to have a syndrome register 220, an erasure locator register 221, data buses 222 to 226, input registers 22 to 230, a first operating circuit 231, a second operating circuit 232, an instruction read-only-memory (ROM) 233, a program counter 234, an error locator polynomial register 235, an error evaluator polynomial register 236, and a reference register 237.

Next, the description will be oriented to the operation of the polynomial generating unit 211 shown in FIG. 5.

The syndrome 3b and the erasure locator number 3j output from the input unit 210 (see FIG. 4) are held in the syndrome register 220 and the erasure locator number register 221, respectively.

These pieces of data are selected by an instruction n stored in an instruction ROM 233 and then output to the data buses 222 to 226.

The data buses 222 to 225 are connected to the input registers 227 to 230 of the first and the second operating circuits 231 and 232. The data stored in the input registers 227 and 228 are processed in the first operating circuit 231 and the data stored in the input registers 229 and 230 are processed in the second operating circuit 232.

The operating circuit 231 provides an operating element 231e and the operating circuit 232 provides an operating element 232e. Those operating elements 231e and 232e enable to execute an addition and a multiplication on the Galois field of the basis of the instruction. The operated result is stored in the addresses specified in operating registers 231r and 232r based on an instruction. The operating registers 231r and 282r are provided in the operating circuits 231 and 232, respectively.

The outputs of the operating registers 231r and 232r are connected to the data buses 222 to 226. The readout address is determined by an instruction in each independent bus.

On the data bus 226, there are output each degree coefficient of the error locator polynomial 3d and the error evaluator polynomial 3e and an error number 3c and a reference syndrome 3q.

The address of the instruction ROM 233 is given by the program counter 234. The program counter 234 is branched through the effect of the instruction ROM 233. As such, the absolute or relative jump address is given from the instruction ROM 233.

Several kinds of correcting algorithms are prepared in the instruction ROM 233. Depending on the correcting mode, the code arrangement, the number of erasure, and the error number 3c obtained by the polynomial generating unit 211, the correcting algorithm is properly branched for executing the correcting process in a manner to flexibly and rapidly cope with the error condition.

Figure 6:
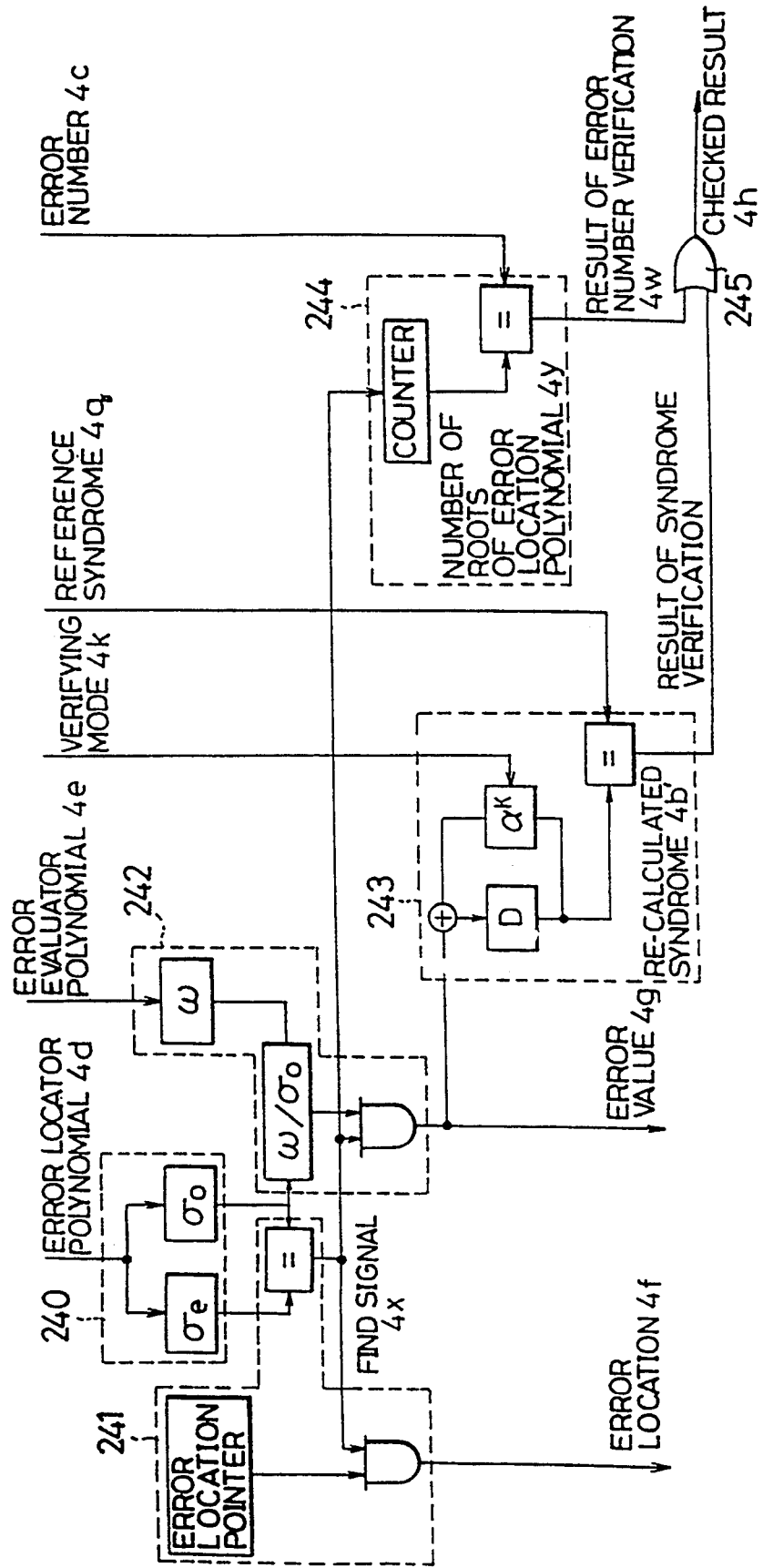
FIG. 6 is a block diagram showing an arrangement of a polynomial estimating unit included in the decoding device shown in FIG. 4.

FIG. 6 shows an arrangement of the polynomial estimating unit 212 shown in FIG. 4.

The polynomial estimating unit 212 shown in FIG. 6 is arranged to have an error locator polynomial estimating unit 240, an error location output unit 241 connected to the error locator polynomial estimating unit 240, an error value output unit 242 connected to the error locator polynomial estimating unit 240 and the error location output unit 241, a syndrome verifying unit 243 connected to the error value output unit 242, an error number output unit 244 connected to the error value output unit 242, and a checked result output unit 245 connected to the syndrome verifying unit 43 and the error number output unit 244.

Next, the description will be oriented to the operation of the polynomial estimating unit 212 shown in FIG. 6.

When estimating the error locator polynomial 4d, the error locator polynomial estimating unit 240 operates to divide the error locator polynomial into even degree terms an odd degree terms and substitute the elements of the Galois field into the even degree terms and the odd degree terms for obtaining a proper value of the polynomial.

When the error locator polynomial estimating unit 240 finds a solution, the error location output unit 241 operates to gate an output of an error location pointer synchronized with the elements of the Galois field to be substituted by means of a find signal for obtaining an error location, because the sum $\sigma_e$ of even degree terms is identical to the sum $\sigma_o$ of odd degree terms By dividing the estimated result $\omega$ by the sum $\omega_o$ of odd degree terms, the magnitude of the error can be obtained. Hence, like the error location 4f, the error value output unit 242 serves to gate the error location pointer by means of a find signal for obtaining an error value 4g.

The syndrome verifying unit 243 serves to compare the syndrome 4b' derived for a trial from the error with the verifying syndrome 4q sent from the polynomial generating unit 211, as a check for the corrected result, and to determine that the verified result is correct if matched.

The error number output unit 244 compares the count of the solutions found through the effect of the Chien search with the error number 4c sent from the polynomial generating unit 211 and determines that the error number 4c is correct if matched.

The checked result output unit 245 serves to output a logic OR of the outputs from the syndrome verifying unit 243 and the error number output unit 244 as a checked result 4h output from the polynomial estimating unit 212.

Hereafter, the description will be oriented to a verifying circuit for an error-corrected result according to an embodiment of the present invention.

Before explaining the embodiment, a method used in the verifying circuit will be described.

It is assumed that the data train to be input to the error correcting circuit is $D_{n-1}$, $D_{n-2}$, $D_{n-3}$ .... $D_2$, $D_1$, $D_0$ or the syndrome $S_x$ used for correction is $$S_x = D_{n-1}\alpha^{x(n-1)} + D_{n-2}\alpha^{x(n-2)} + \quad \text{[Expression 17]}$$
$$D_{n-3}\alpha^{x(n-3)} + \ldots + D_2\alpha^{2x} + D_1\alpha^x + D_0$$

where n denotes a length of a code, a denotes a source element of a Galois field $GF(q^m)$ (q is a prime number and m is a natural number), and x is 0 or a natural number.

In the assumption, the operation of $$\sum_{i=0}^{n-1} \{D_i' \times \alpha^{-x(n-1-i)}\} + S_x \times \alpha^{-x(n-1)} \quad \text{[Expression 18]}$$

where $D_i$ denotes a value of an error of an error locator $\alpha^i$, is executed. The correction is verified on whether or not the resulting value is zero.

Figure 8:
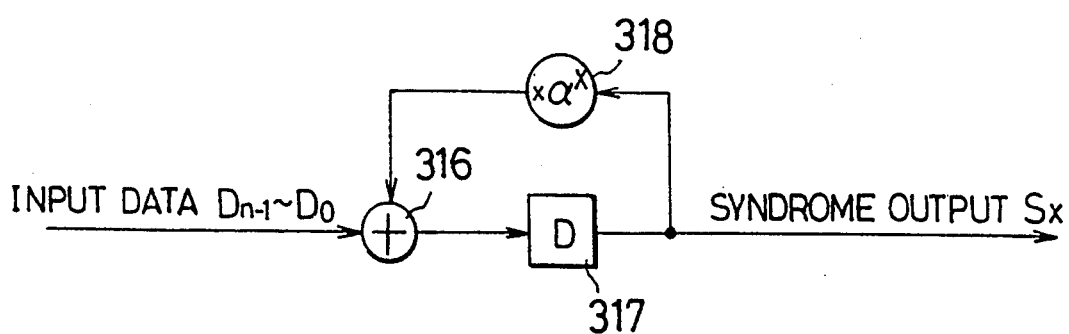
FIG. 8 is a block diagram showing an arrangement of a syndrome operating circuit.

The data train about an error size output from the Chien search circuit after computing an error location and an error size is $D_0'$, $D_1'$, $D_2'$..., $D_{n-3}'$, $D_{n-2}'$, $D_{n-1}'$ (where $D_i'$ represents an error value of $D_i$) which are ranged inverted sequence to the input data train. Hence, the syndrome operating circuit shown in FIG. 8 cannot calculate any syndrome. This data train is operated by the verifying circuit shown in FIG. 9. The operating result is $$S_x' = D_0'\,\alpha^{-x(n-1)} + D_1'\,\alpha^{-x(n-2)} + \quad \text{[Expression 19]}$$
$$D_2'\,\alpha^{-x(n-3)} + \ldots + D_{n-3}'\,\alpha^{-2x} + D_{n-2}'\,\alpha^{-x} + D_{n-1}'$$

If the correction is proper, the following expression is established;

$$S_x' = \alpha^{-x(n-1)} \times S_x$$

$$\therefore S_x' + \{\alpha^{-x(n-1)} \times S_x\} = 0$$

$$\therefore (S_x + D_0')\,\alpha^{-x(n-1)} + D_1'\alpha^{-x(n-2)} + D_2'\alpha^{-x(n-3)} + \ldots + D_{n-3}'\alpha^{-2x} + D_{n-2}'\alpha^{-x} + D_{n-1}' = 0$$

[Expression 20]

Figure 9:
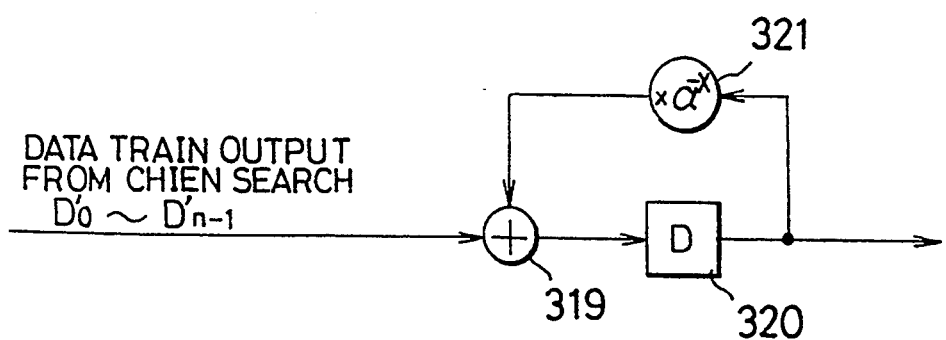
FIG. 9 is a block diagram showing an arrangement of a part of the verifying circuit for an error-corrected result shown in FIG. 7.

Hence, by adding only the data $D_0'$ about an initial error size output by the Chien search to the syndrome $S_x$ and inputting the added value into the verifying circuit shown in FIG. 9, the verification about a correction can be performed without any delay on whether or not the output value is zero when the data $D_{n-1}'$ about the last error size is read by the flip-flop 320.

The verifying circuit shown in FIG. 9 is arranged to have an adder 319, a flip-flop 320 connected to the adder 319, and a multiplier 321 connected to the adder 319 and the flip-flop 320.

Next, the description will be oriented to a verifying circuit for an error-corrected result according to an embodiment of the present invention.

Figure 7:
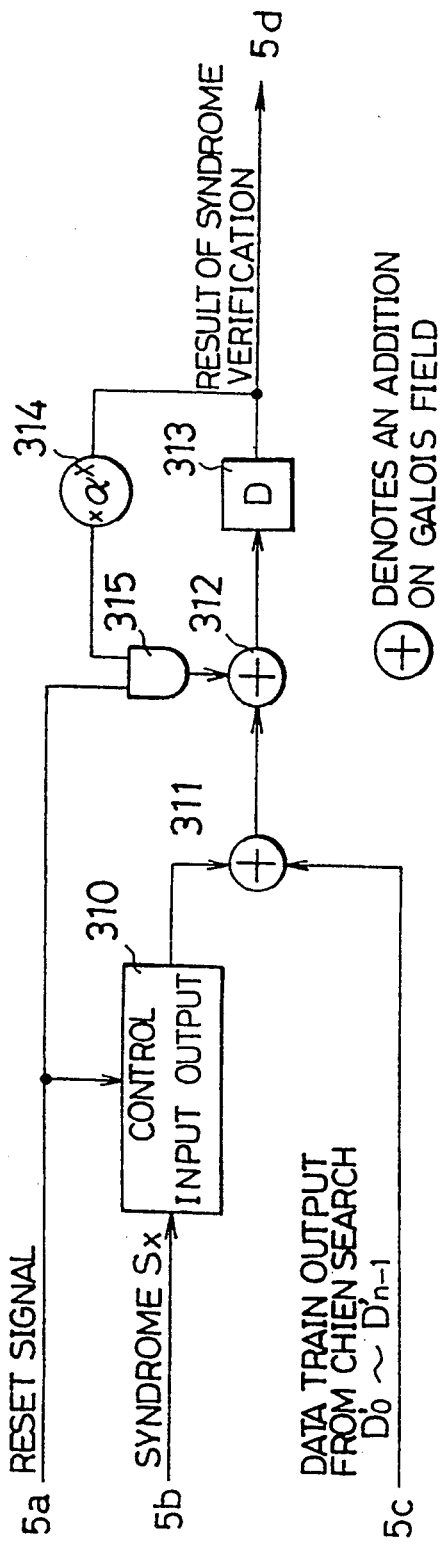
FIG. 7 is a block diagram showing an arrangement of a verifying circuit for an error-corrected result according to embodiment of the present invention.

FIG. 7 shows an arrangement of an verifying circuit for an error-corrected result (referred simply to as a verifying circuit) according to an embodiment of the invention. The arrangement is a concrete one of that shown in FIG. 9.

The verifying circuit shown in FIG. 7 is arranged to have a selecting circuit 310, a first adder 311 connected to the selecting circuit 310, a second adder 312 connected to the first adder 311, a flip-flop 313 and a multiplier 314 both connected to the second adder 312, and an AND circuit 315 connected to the selecting circuit 310, the second adder 312 and the multiplier 314. The AND circuit 315 makes up of a logic circuit element.

Next, the operation of the verifying circuit shown in FIG. 7 will be described later.

The selecting circuit 310 receives at its input terminal the syndrome $S_x$ used for verification as an input signal, at its control terminal a synchronous reset signal which is held low only at the head data $D_0'$ of the data train output from the Chien search circuit (not shown) and supplies the input signal without any change when the control terminal is at low level and a zero signal when it is at high level.

Next, the operating process of the verifying circuit showing FIG. 7 will be discussed in detail.

The first adder 311 receives an output of the selecting circuit 310 and a data train $D_0'$ to $D_{n-1}'$ indicating an error value output from the Chien search circuit. In response, the first adder 311 supplies an output of $$(S_x + D_0'), D_1', D_2', \ldots, D_{n-3}', D_{n-2}', D_{n-1}'$$

[Expression 21]

The output of the first adder 311 is input to the circuit arranged of the second adder 312, the flip-flop 313, the multiplier 314 of the Galois field $\alpha^{-x}$. When the data $D_{n-1}'$ indicating a last error value is read by the flip-flop 318, the circuit supplies an output of $$(S_x + D_0')\,\alpha^{-x(n-1)} + D_1'\,\alpha^{-x(n-2)} + \quad \text{[Expression 22]}$$
$$D_2'\,\alpha^{-x(n-3)} + \ldots + D_{n-3}'\,\alpha^{-2x} + D_{n-2}'\,\alpha^{-x} + D_{n-1}'$$

It is determined that the correction is proper depending on whether or not the value of the expression 8 is zero.

The reset signal is input to the AND circuit 315 so as to initialize the flip-flop 313.

That is, the verifying circuit according to the invention generates a syndrome $S_x$ from the data train $D_{n-1}$, $D_{n-2}$, $D_{n-3}$, .., $D_2$, $D_1$, $D_0$ input to the error correcting circuit and the operation on the Galois field of the error locator $\alpha^i$, $$S_x = D_{n-1}\alpha^{x(n-1)} + D_{n-2}\alpha^{x(n-2)} + \quad \text{[Expression 23]}$$
$$D_{n-3}\alpha^{x(n-3)} + \ldots + D_2\alpha^{2x} + D_1\alpha^x + D_0$$

Then, according to a relation formula of a verified result $r_i$ indicating an addition of the error value $D_i'$ of the error locator $\alpha^i$ obtained as a corrected result to the syndrome $S_x$, that is, $$r_i = S_x + D_i' \,(i=0)$$

[Expression 24]

and according to a relation formula of a verified result $r_i$ indicating a multiplication of the Galois field $\alpha^{-x}$ and the error value $D_i'$ of the input data $D_i$ of the error locator $\alpha^i$ and an addition of the multiplied result to the verified result $r_{i-1}$, that is, $$r_i = r_{i-1} \times \alpha^{-x} + D_i, \,(i>0)$$

[Expression 25]

The verifying circuit performs an operation so that it may determine whether or not the verified result $r_{n-1}$ is zero when the last data $D_{n-1}$ at the output of the Chien search is input to the circuit. The determined result indicates whether or not the corrected result is proper.

The selecting circuit 310 may be easily arranged by the gate and the multiplexer.

Figure 10:
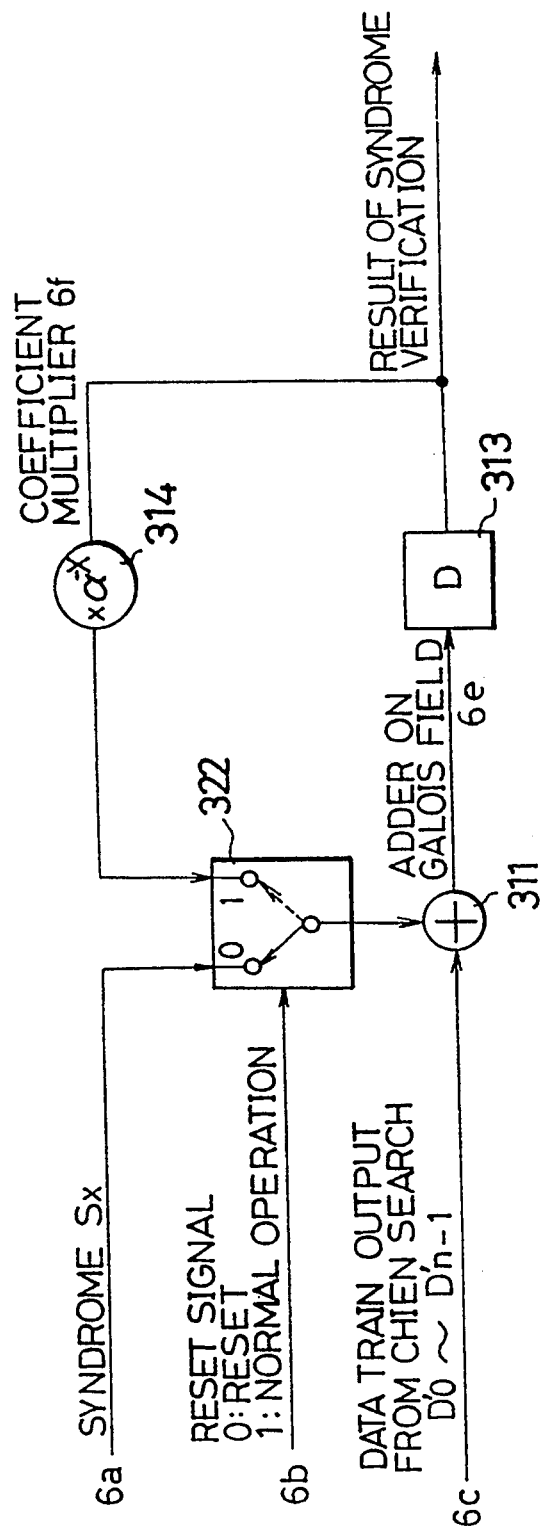
FIG. 10 is a block diagram showing an arrangement of a verifying circuit for an error-corrected result according to a second embodiment of the present invention.
Figure 11:
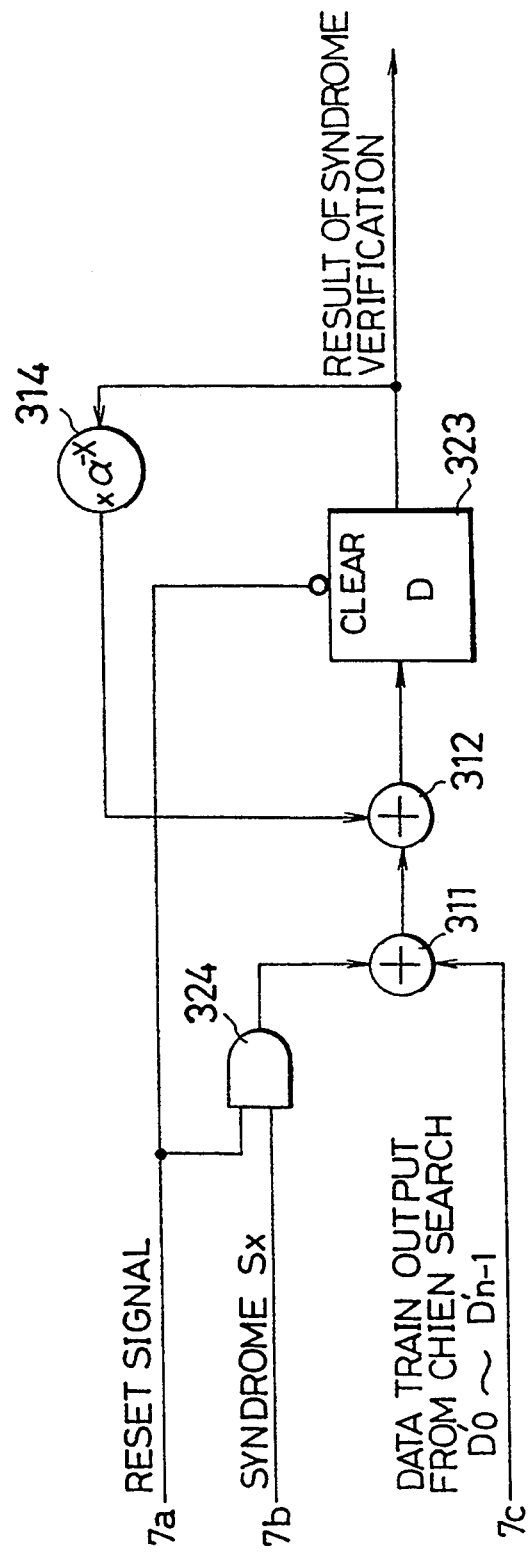
FIG. 11 is a block diagram showing an arrangement of a verifying circuit for an error-corrected result according to a third embodiment of the present invention.

The other embodiments will be shown in FIGS. 10 and 11.

The embodiment shown in FIG. 10 does not include the adder 312 and the AND circuit 315 included in the embodiment shown in FIG. 7. The embodiment shown in FIG. 11 does not include the AND circuit 315 included in the embodiment shown in FIG. 7. Those embodiments operate in a similar manner to the embodiment shown in FIG. 7. Hence, the description is left out.

The foregoing arrangement makes it possible to obtain the verified result at an output terminal without consuming an operating time too much.

Hereafter, the description will be oriented to an error correcting circuit according to an embodiment of the present invention.

Figure 12:
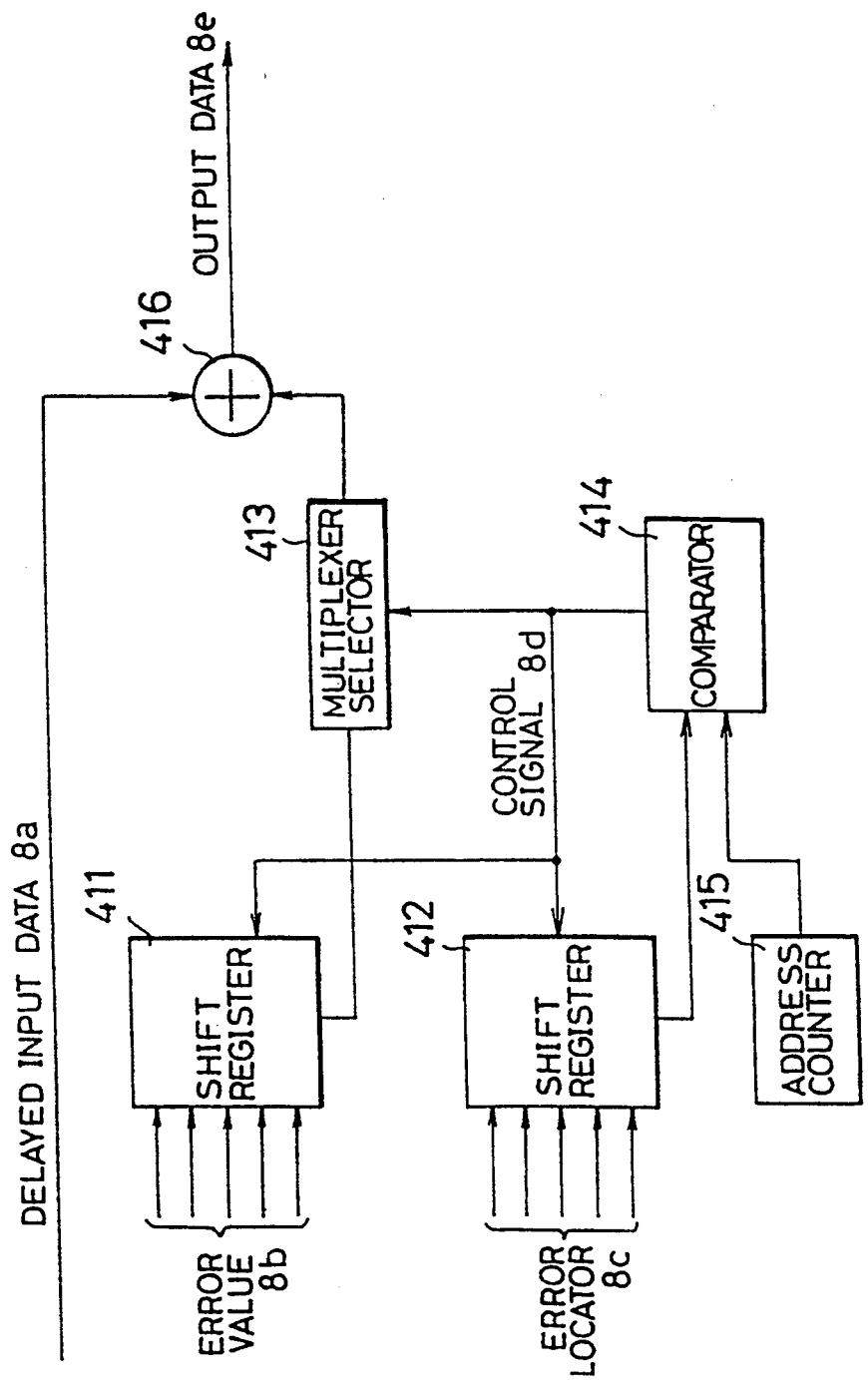
FIG. 12 is a block diagram showing an arrangement of an error correcting circuit according to a first embodiment of the present invention.

FIG. 12 shows an arrangement of an error correcting circuit according to a first embodiment of the present invention.

The error correcting circuit shown in FIG. 12 is arranged to have a shift register 411, a shift register 412, a selecting circuit 413 connected to the shift register, a comparator 414 connected to the shift register 412 and the selecting circuit 413, an address counter 415 connected to the comparator 414, and an adder 418 connected to the selecting circuit 413.

Next, the operation of the error correcting circuit will be described as referring to FIG. 12.

At first, the error location data for the second data corresponding to K symbols (K is an integer meeting with the condition of $1 \leq K$), obtained by the operation and analyzing unit (not shown), is stored in the shift register 412 in the order of addresses.

In this case, the direction of the addresses are set to locate the head side of the input data to the error correcting circuit to the output side of the shift register 412.

Further, the error-value data, that is, first data, is stored in the shift register 411 in the magnitude order.

Next, the address counter 415 operates to count the input data to the error correcting circuit from the head side in synchronous with the delayed input data. The count value corresponding to the third data is compared with the output of the shift register 412 in the comparator 414. If not matched, non-match signal is sent to the shift register 411, the shift register 412, and the selecting circuit 413 in a manner to prohibit data shit in the shift registers 411 and 412, and to indicate an output of zero in the selecting circuit 413.

As such, the symbol determined not to be erroneous in the delayed input data train is output to the external as it is.

If matched, the comparator 414 sends a match signal corresponding to a predetermined signal to the shift register 411, the shift register 412 and the selecting circuit 413. The selecting circuit 413 outputs the data about an error value and the adder 416 corrects the input data. The shift registers 411 and 412 serve to shift data by one stage for waiting a next correction.

The selecting circuit 413 is easily arranged of a gate and a multiplexer. In place of the adder 416, the subtracter 416 may be used according to the type of the code.

Figure 13:
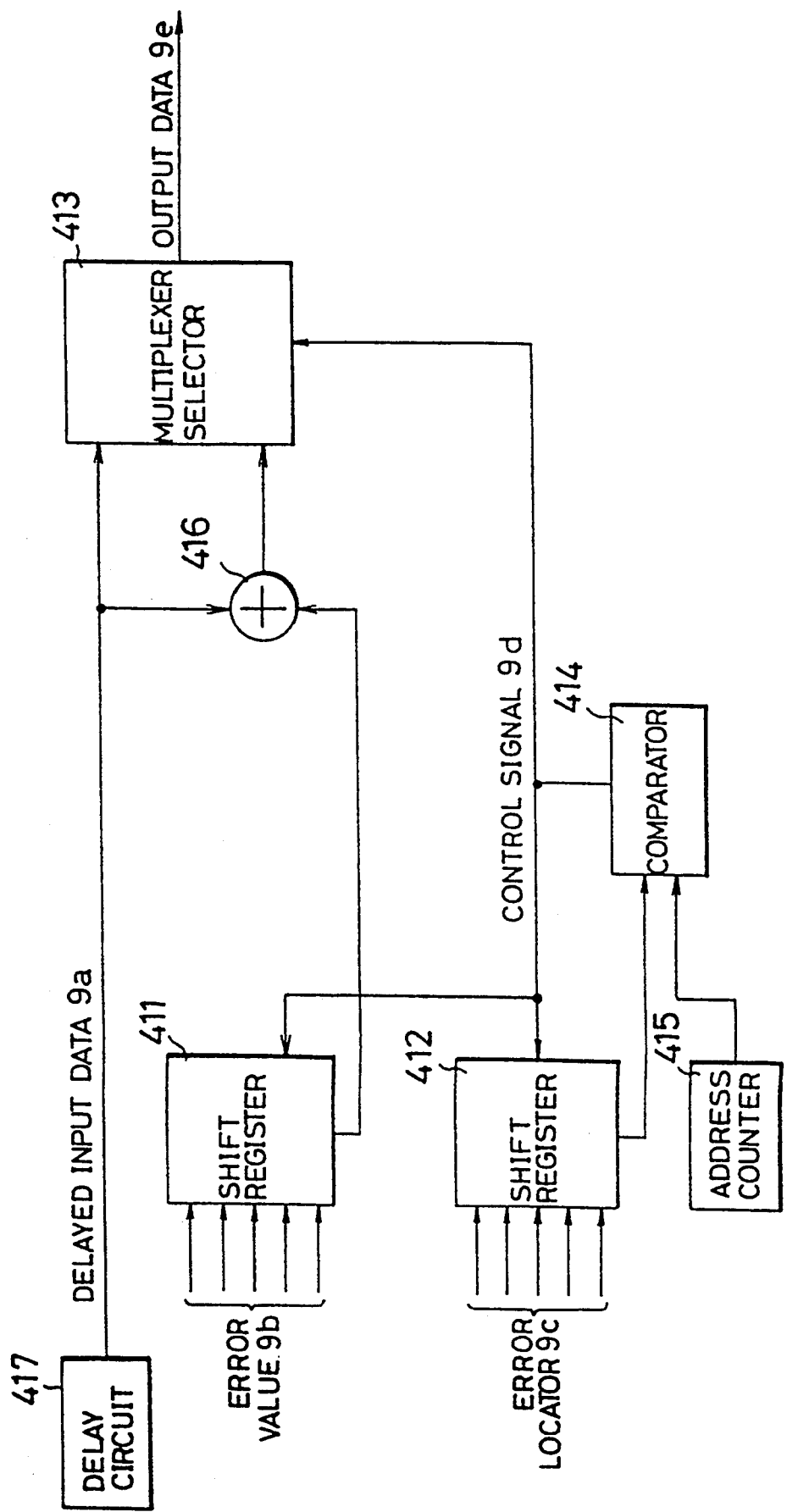
FIG. 13 is a block diagram showing an arrangement of an error correcting circuit according to a second embodiment of the present invention.

In the error correcting circuit according to the second embodiment of the invention, as shown in FIG. 13, the selecting circuit 413 is provided at the last stage so as to select an added result of the delayed input data and the output of the shift register 411 in response to a control signal before outputting.

Next, the operation of the selecting circuit 413 according to the second embodiment of the invention will be described later.

As shown, the different respect of the second embodiment from the first embodiment is that the selecting circuit 413 is connected to receive the input data train and an output of the adder 416 for constantly adding the output of the shift register 411 to the input data train.

The operation analyzing unit sends the error location to the shift register 412. The comparator 414 compares an address value counted by the address counter 415 with the error location data sent from the shift register 412. If not matched the comparator 414 sends to a non-match signal to the shift register 411, the shift register 412, and the selecting circuit 413 so as to indicate the prohibit of data shift to the shift register and the prohibit of correction in the selecting circuit 413. As such, the symbol determined not to be erroneous in the delayed input data train is output to the external as is.

On the other hand, if both are matched in the comparator 414, the comparator 414 sends a match signal to the shift register 411, the shift register 412 and the selecting circuit 413. The selecting circuit 413 serves to select an output of the adder for constantly adding the input data train to the output of the shift register 411 for executing the correction of the input data. The shift register serves to shift the data by one stage and output the next error location data and error value data for waiting a later correction. In place of the adder 416, like the abovementioned embodiment, the subtracter may be used according to the type of the code.

Figure 14:
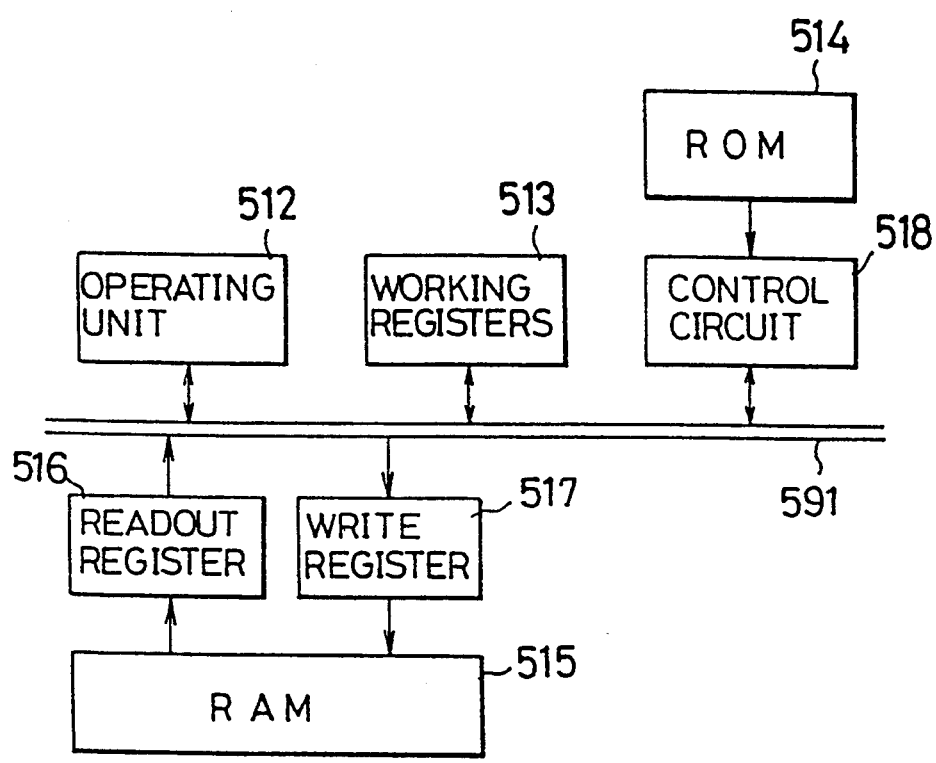
FIG. 14 is a block diagram showing an ECC circuit for erasure plus error correction according to an embodiment of the present invention.

FIG. 14 is a block diagram showing an error correcting circuit (referred to as an ECC circuit) for executing an erasure plus error correction according to an embodiment of the present invention. As shown, a numeral 511 denotes a data bus. A numeral 512 denotes an operating unit. A numeral 513 denotes a group of working registers. A numeral 514 denotes a read-only memory (ROM) for storing a microcode. A numeral 515 denotes a random-access memory (RAM) for storing a transmitted word or a received word. A numeral 516 denotes a readout register, A numeral 517 denotes a write register. A numeral 518 denotes a control circuit. The control circuit 518 operates to sequentially read a microcode from the ROM 514 in a manner to control the operation of the overall ECC circuit. The EGG circuit according to this embodiment is arranged to read out a received word from the RAM 515, correct the received word, and write the corrected received word in the RAM 5 for decoding it. The correction for the received word is executed to perform necessary operations such as additions and multiplications through the effect of the operating unit 512 as storing the intermediate result of an operation in the group of working registers 518 for deriving an error location and an error value, The received word is read out through the readout register 516 and the received word is corrected through the write register 517.

If the erasure plus error correction is performed in this circuit, the error number m can be obtained as the largest integer allowing an m-degree square matrix $G_m'$ indicated below to be non-singular independently of the drop number h;

[Expression 26]

$$G_m' = \begin{pmatrix} T_{d-m-2} & T_{d-m-3} & \cdots & T_{d-2m-1} \\ T_{d-m-1} & T_{d-m-2} & \cdots & T_{d-2m} \\ \cdot & \cdot & & \cdot \\ \cdot & \cdot & & \cdot \\ \cdot & \cdot & & \cdot \\ T_{d-3} & T_{d-4} & \cdots & T_{d-m-2} \end{pmatrix}$$

-continued where $$\left\{\prod_{i=1}^{h}(1-X_i z)\right\}\left(\sum_{i=0}^{d-2}s_i z^i\right)\left(\sum_{i=0}^{d-2}T_i z^i\right) \pmod{z^{d-1}}$$ [Expression 27]

with $h + 2m \leq d - 1$, $h \geq 1$.

Accordingly, the coefficients $\sigma_1, \sigma_2, \ldots, \sigma_m$ of the error locator polynomial $\sigma(z)$ for only the errors are obtained by the following linear equation of;

$$G_m'\begin{pmatrix}\sigma_1\\\sigma_2\\\cdot\\\cdot\\\cdot\\\sigma_m\end{pmatrix}=\begin{pmatrix}T_{d-m-1}\\T_{d-m}\\\cdot\\\cdot\\\cdot\\T_{d-2}\end{pmatrix}$$ [Expression 28]

A method of generating the above linear equation will be described later. In the expression, $\omega(z)$ is an (n-1) th degree expression. Hence, the coefficients from a (d-m-1) th (note:$h+2m \leq d-1$ to $d-m-1 \geq h+m=n \geq 1$) degree to a (d-2) th degree on the left side are made zero. That is, $$T_i\sigma_0 + T_{i-1}\sigma_1 + \ldots + T_{i-m}\sigma_m = 0,$$ [Expression 29]
with $i = d - m - 1, d - m, \ldots, d - 2$.

Then, since $\sigma_0=1$ is given, the following simultaneous linear equations are established;

$$T_{i-1}\sigma_1 + T_{i-2}\sigma_2 + \ldots + T_{i-m}\sigma_m = T_i,$$ [Expression 30]
with $i = d - m - 1, d - m, \ldots, d - 2$.

The matrix representation of these equations corresponds to the expression.

Figure 15:
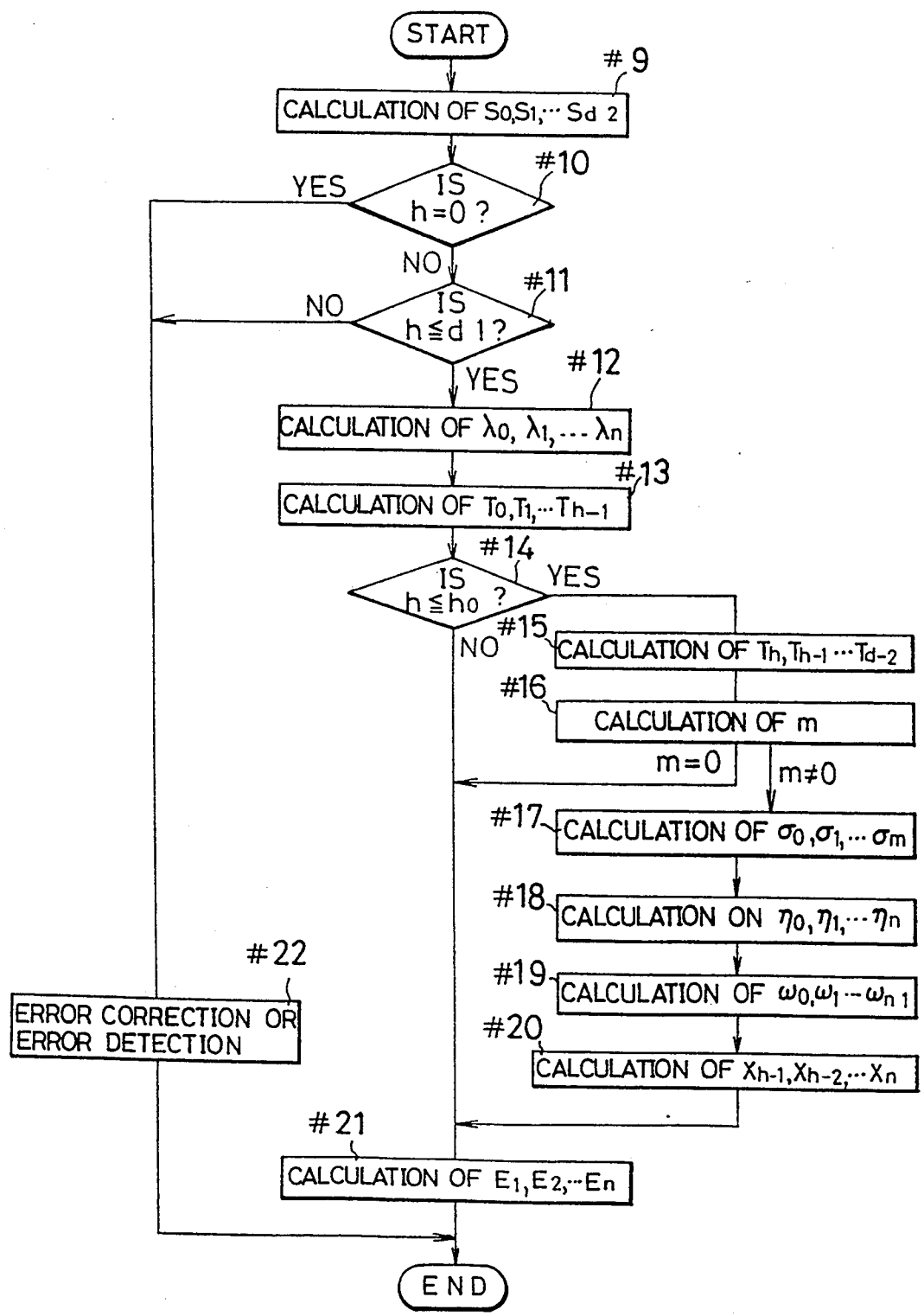
FIG. 15 is a flowchart showing erasure correction and erasure plus error correction according to an embodiment of the present invention.

FIG. 15 is a flowchart according to a program for erasure correction and erasure plus error correction according to an embodiment of the invention. By obtaining the drop error value $E_i$ ($i=1, 2 \ldots h$) for the erasure correction with the expression indicated below, one program may be commonly used for the erasure correction and the erasure plus error correction.

$$E_i = \left(\sum_{j=0}^{h-1}T_j X_i^{-j}\right)/\lambda_{odd}(X_i^{-1})$$ [Expression 31]

Herein, how the above expression is generated will be described below. In the decoding operation for erasure plus error correction, given $m=0$, the value of each syndrome $s_k$ ($k=0, 1 \ldots d-2$) represented by the expression 10 matches to the value of the syndrome $s_k$ for erasure correction represented by the expression 4. From the expressions 9 and 17, $$U(z) = T(z) \pmod{z^h}$$

[Expression 32]

is established.

At the step #9, the syndromes $s_0, s_1 \ldots s_{d-2}$ are calculated from the received word.

At the next step #10, it is determined whether or not the erasure exists. If the erasure number h is equal to zero, since the erasure correction or the erasure plus error correction is not executed, the operation goes to a step #22 for performing error correction or error detection. Then, this program is terminated.

At the step #10, if the erasure number h is equal to one or more, the operation goes to a step #11 at which it is determined whether or not the erasure number h is d-1 or less. If the erasure number h is larger than d-1, no erasure correction and erasure plus error correction are executed. Hence, the operation goes to a step #22 at which the error correction or error detection is executed. Then, the program is terminated.

At a step #11, if the erasure number h is d-1 or less ($1 \leq h \leq d-1$), the operation goes to a step #12 at which the coefficients $\lambda_0, \lambda_1, \ldots, \lambda_h$ of the terms of the polynomial $\lambda(z)$ are calculated. In succession, at a step #13, from the syndrome $s_i$ ($i=0, 1 \ldots d-2$) obtained at the step #9 and each coefficient $\lambda_i$ ($i=0, 1$ h) of the polynomial $\lambda(z)$ obtained at the step #12, the coefficients $T_0, T_1 \ldots T_{h-1}$ from a zero-degree to a (h-1) th degree of the polynomial T(z) are calculated.

And, at the step #14, it is determined whether or not the error correction is to be done. That is, it is determined whether or not the erasure number h is equal to $h_0$ (=d-3) or less. Though described in the Prior Art, the maximum value $h_0$ of the erasure number h may be set as a smaller value than d-3 such as d-4 or d-5.

If the erasure number h is larger than $h_0$ at the step #14, the operation goes to a step #21 at which the erasure error values $E_1, E_2 \ldots E_h$ are calculated from the polynomials $\lambda(z)$ and T(z) obtained at the steps #12 and #13 on the basis of the expression 27. Then, this program is terminated.

If the erasure number h is equal to or less than $h_0$ at the step #14, the operation goes to the steps #15 and #16 for obtaining the number m of errors. The coefficients $T_h, T_{h+1} \ldots T_{d-2}$ of the polynomial T(z) from a h-th degree to a (d-2) th degree are obtained at the step #15 as follows;

[Expression 33]
$$\begin{aligned}T_h &= \lambda_h s_0 + \lambda_{h-1}s_1 + \ldots + \lambda_0 s_h\\T_{h+1} &= \lambda_{h+1}s_0 + \lambda_h s_1 + \ldots + \lambda_0 s_{h+1}\\&\vdots\\T_{d-2} &= \lambda_{d-2}s_0 + \lambda_{d-3}s_1 + \ldots + \lambda_0 s_{d-2}\end{aligned}$$

Next, the error number m is calculated at the step #18 on the basis of the expression 24. If the error number m is equal to zero, no errors except erasure exist. The operation goes to the step #21 at which the erasure error values $E_1, E_2 \ldots E_h$ are calculated. Then, the operation is terminated.

If the error number m is not equal to zero at the step #16, the calculations are carried out from the steps #17 to #18, #19, #20, and #21. At the step #17, the coefficients $\sigma_1, \sigma_2, \ldots, \sigma_m$ of the error locator polynomial $\sigma(z)$ only for the errors are calculated on the basis of the expression 26. In addition, $\sigma_0=1$ may be given.

Next, at the step #18, the coefficients $h_0, h_1 \ldots h_n$ of the terms of the polynomial $\eta(z)$ are calculated by the equation of $\eta(z)=\lambda(z)\sigma(z)$. At the step #19, the coefficients $\omega_0, \omega_1, \ldots, \omega_n$ of the terms of the polynomial $\omega(z)$ are calculated on the expression 20. At the step #20, the error locator $X_{h+1}, X_{h+2}, \ldots X_n$ are calculated as reverses of the solutions $X_{h+1}^{-1}, X_{h+2}^{-1}, \ldots, X_n^{-1}$ of the equation $\sigma(z)=0$. In succession, at the step #21, the erasure values $E_1, E_2, \ldots E_h$ and the values of errors $E_{h+1}, E_{h+2}, \ldots E_n$ are calculated on the basis of the expression 13. Then, the program is terminated.

The flowchart shown in FIG. 15 is terminated at the step where the erasure values $E_1, E_2, \ldots E_n$ and errors are calculated. In actual, the erasure values and errors are added to the received word. Then, the received word is corrected in a manner to complete decoding.

In the calculations at the steps #16, #17, #18 and #19 of this flowchart, it is necessary to make sure of whether or not the branch to be done on a value of h or m is required. Further, the maximum value $m_0$ of the error number m is 2.

(i) "Calculation of m" Part at the step #16

Figure 16:
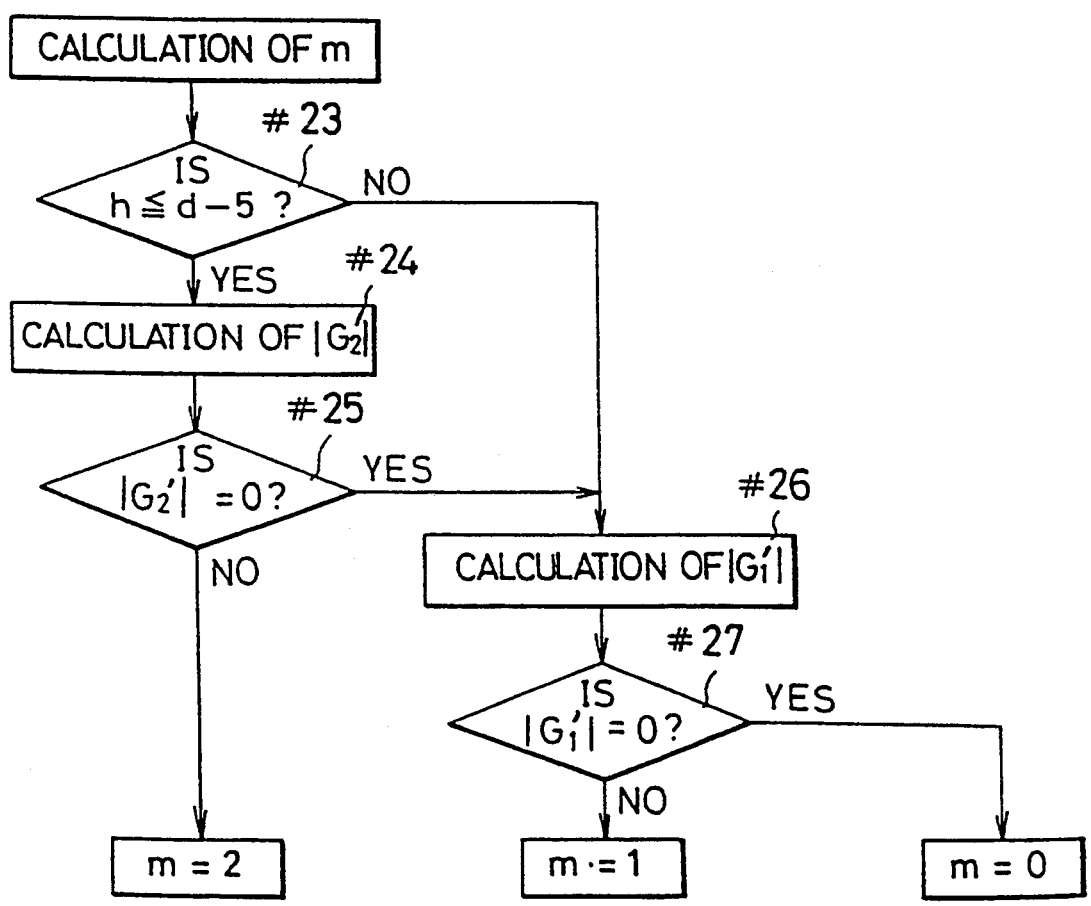
FIG. 16 is a flowchart showing "calculation of m" shown in FIG. 15 according to an embodiment of the present invention.

FIG. 16 is a flowchart showing this embodiment.

At the step #23, it is determined whether or not the erasure number h is equal to or less than d-5. If the drop number h is equal to or less than d-5, the operation goes to a step #24 at which the determinant $|G_2'|$ of the secondary square matrix $G_2'$ is calculated. Then, at the step #25, it is determined whether or not $|G_2'|$ is zero. If $|G_2'|$ is not zero, the error number m is set as 2.

If the erasure number h is larger than d-5 at the step #23 or if the determinant $|G_2'|$ is determined to be zero at the step #25, the operation goes to a step #26 at which the determinant $|G_1'|$ of the primary square matrix $G_1'$ is calculated. Then, at the step #27, it is determined whether or not the value of $|G_1'|$ is equal to zero. If $|G_1''|$ is not zero, the error number m is set as 1. If the value of $|G_1''|$ is zero at the step #27, the error number m is set as zero.

In the calculations of the determinants of $|G_2''|$ and $|G_1'|$ at the steps #24 and #26, it is not necessary to make any branch depending on the drop number h. In the flowchart shown in FIG. 16, however, the branch to be done on a value of m is necessary.

(ii) Part "calculation of $\sigma_0, \sigma_1, \ldots, \sigma_m$" at the step #17 if m=1, they are calculated as
$\sigma_0 = 1$
$\sigma_1 = T_{d-2}/T_{d-3}$

[Expression 34]

if m=2, $|G_2'| = (T_{d-3}T_{d-5} + T_{d-4}^2)$ is established. Hence, they are calculated as $\sigma_0 = 1$ $\sigma_1 = (T_{d-2}T_{d-5} + T_{d-3}T_{d-4})/|G_2'|$ $\sigma_2 = (T_{d-2}T_{d-4} + T_{d-3}^2)/|G_2'|$

[Expression 35]

This calculation needs a program branch on a value of m but does not need a program branch to be done on a value of h. In the "calculation of m" part at the step #16, the program has been already branched on a value of m. In the part at the step #17, the calculation is kept going with the program being branched.

(iii) "Calculation of $\eta_0, \eta_1, \ldots, \eta_n$" and "calculation of $\omega_0, \omega_1, \ldots, \omega_{n-1}$"

If m=1, they are calculated as $\eta_0 = 1$  [Expression 36]
$\eta_1 = \lambda_1 + \sigma_1$
$\eta_2 = \lambda_2 + \lambda_1\sigma_1$
.
.
.
$\eta_i = \lambda_i + \lambda_{i-1}\sigma_1$
.
.
.
$\eta_{n-1} = \lambda_h + \lambda_{h-1}\sigma_1$
$\eta_n = \lambda_h\sigma_1$,
and
$\omega_0 = T_0$  [Expression 37]
$\omega_1 = T_1 + T_0\sigma_1$
$\omega_2 = T_2 + T_1\sigma_1$
.
.
.
$\omega_i = T_i + T_{i-1}\sigma_i$
.
.
.
$\omega_{n-2} = T_{h-1} + T_h\sigma_1$
$\omega_{n-1} = T_h + T_{h-1}\sigma_1$ $\eta_0 = 1$  [Expression 38]
$\eta_1 = \lambda_1 + \sigma_1$
$\eta_2 = \lambda_2 + \lambda_1\sigma_1$
.
.
.
$\eta_i = \lambda_i + \lambda_{i-1}\sigma_1 + \lambda_{i-2}\sigma_2$
.
.
.
$\eta_{n-1} = \lambda_h\sigma_1 + \lambda_{h-1}\sigma_2$
$\eta_n = \lambda_h\sigma_2$,
and
$\omega_0 = T_0$  [Expression 39]
$\omega_1 = T_1 + T_0\sigma_1$
$\omega_2 = T_2 + T_1\sigma_1$
.
.
.
$\omega_i = T_i + T_{i-1}\sigma_1 + T_{i-2}\sigma_2$
.
.
.
$\omega_{n-2} = T_h + T_{h-1}\sigma_1 + T_{h-2}\sigma_2$
$\omega_{n-1} = T_{h+1} + T_h\sigma_1 + T_{h-2}\sigma_2$ That is, "calculation of $\eta_0, \eta_1, \ldots, \eta_n$" and "calculation of $\omega_0, \omega_1, \ldots, \omega_{n-1}$" are executed by dividing a value of m into m=1 and m=2. If m=1, $\sigma_2=0$ is preset and those calculations may be executed by the expressions in place of the former expressions, resulting in giving the same result. In these calculations, $\eta_n=\eta_{h+2}$ and $\omega_{n-1}=\omega_{h+1}$ are additionally calculated. Since $\sigma_2=0$, $\eta_{h+2}=0$ is given. Since $\omega_{h+1}$ is a coefficient of an n-degree ((h+1)th degree) on the left side of the expression 20, $\omega_{h+1}=0$ is given. Hence, "calculation of $\eta_0, \eta_1, \ldots \eta_n$" and "calculation of $\omega_0, \omega_1, \ldots \omega_{n-1}$" are executed by the expressions even though a value of m is variable. Herein, the maximum value $m_0$ of m is assumed as 2. Those calculations may correspond to any value of $m_0$. The branch of the program according to a value of m is not necessary.

It is to be understood from the above expressions (i), (ii) and (iii) that the erasure plus error correction needs a program branch on a value of m but does not need a branch on a value of h in the parts of "calculation of m" and "calculation of $\sigma_0, \sigma_1, \ldots \sigma_m$".

Many widely different embodiments of the present invention may be constructed without departing from the spirit and scope of the present invention. It should be understood that the present invention is not limited to the specific embodiments described in the specification, except as defined in the appended.

What is claimed is:

1. An operating circuit of a Galois Field for executing an operation of said Galois field comprising:

first operating means for receiving two elements of a Galois field, for performing an addition or a multiplication of said two elements, and for outputting a first operational result thereof;

second operating means for receiving another two elements of said Galois field, for performing an addition or a multiplication of said another two elements, and for outputting a second operational result thereof;

third operating means connected to both said first operating means and said second operating means for performing an addition of said first operational result and said second operational result on said Galois field, and for outputting a third operational result thereof;

first selecting means connected to both of said first operating means and said third operating means for selecting any one of said first operational result and said third operational result, and for outputting a selected result thereof;

second selecting means connected to both said second operating means and said third operating means for selecting any one of said second operational result and said third operational result, and for outputting said selected result thereof; and determining means connected to said first operating means and said second operating means as well as said third operation means for determining said first operational result and said second operational result as well as said third operational result so as to execute an operation of said Galois field.

2. An operating circuit according to claim 1, wherein said first operating means is an operating circuit which is adapted to perform an operation of two elements X1, X2 of said Galois filed and to output an operational result X.

3. An operating circuit according to claim 2, wherein said second operating means is an operating circuit which is adapted to perform an operation of two elements Y1, Y2 of said Galois field and to output an operational result Y.

4. An operating circuit according to claim 3, wherein said third operating means is an operating circuit which is adapted to execute an addition between said operational result X and said operational result of Y and to output an operational result Z.

5. An operating circuit according to claim 4, wherein said first selecting means is a two-input multiplexer which is adapted to select any one of said operational result X of said operating circuit and said operational result Z of said operating circuit, and to output an operational result A.

6. An operating circuit according to claim 5, wherein said second selecting means is a two-input multiplexer which is adapted to select any one of said operational result Y from said operating circuit and said operational result Z of said operating circuit, and to output an operational result B.

7. An operating circuit according to claim 6, wherein said determining means is a flag determining circuit which is adapted to receive three of said operational results X, Y, Z to output a zero-flag $X_F$ in case that said operational result X is zero, to output a zero-flag $Y_F$ in case that said operational result Y is zero, and to output a zero-flag $Z_F$ in case that said operational result Z is zero.

8. An operating circuit according to claim 7, being adapted to be used with an error-correcting circuit so that said zero flags $X_F$, $Y_F$, $Z_F$ output from said flag decision circuit are used for branching out a flow of an error-correction from said error-correcting circuit according to an error-correction algorithm.

9. An operating circuit according to claim 8 wherein said second operating means is further adapted to execute an arithmetic addition of $Y = Y1 + Y2$ and an arithmetic subtraction of $Y = Y1 - Y2$, wherein said Y1 and Y2 representing elements of said Galois field input to said second operating means.

10. An operating circuit according to claim 9, wherein said determining means is arranged that a carry flag $C_F$ is output from said determining means at a time when said second operating means generates a carry of most significant bit of said operational result Y in said arithmetic addition or a borrow from an upper digit of said most significant bit of said operational result Y in said arithmetic subtraction.

11. An operating circuit according to claim 10, wherein said determining means is further arranged that a sign flag $S_F$ is output from said determining means at a time when said most significant bit of said operational result Y is 1 in said arithmetic addition or said arithmetic subtraction of said second operating means.

12. An operating circuit according to claim 11, wherein said determining means is further arranged that an overflow flag $V_F$ is output from said determining means at a time when overflowing said operational result Y in said arithmetic addition or in said arithmetic subtraction in which said elements Y1 and Y2 of said Galois field represent negative numbers as two's complements.

13. An error correcting circuit adapted to be used in an operating circuit for Galois Field comprising:

an operation analyzing means having a first shift register for a serial-to-parallel conversion, said first shift register serving to sequentially store data of each location and size of errors determined through a chaining search and to convert said stored data into parallel data;

a corrected data outputting means having a second shift register for a parallel-to-serial conversion and connected to said operation analyzing means, said second shift register serving to read said parallel data when pipelines are switched, to convert said parallel data into serial data, and to output said serial data in an inverted sequence to a data train stored in said first shift register for said serial-to-parallel conversion, said operation analyzing means and said corrected data outputting means being operated in parallel in such a manner that said correction outputting means outputs said corrected result by matching an input data train applied into said error correcting circuit with a sequence of data listing.

14. An error correcting circuit according to claim 13, wherein said operating analyzing means is arranged to have an operating section, a $\sigma(z)$ Chien search circuit connected to said operating section, a $\omega(z)$ Chien search circuit connected to said operating section and said Chien search circuit, an operating circuit connected to said Chien search circuits, a first serial-to-parallel conversion shift register connected to said Chien search circuit, and a second serial-to-parallel conversion shift register, connected to said operating circuit and said serial-to-parallel conversion shift register.

15. An error correcting circuit according to claim 14, wherein said corrected data outputting means is arranged to have a first parallel-to-serial conversion shift register connected to said first serial-to-parallel conversion shift register, a second parallel-to-serial conversion shift register connected to said second serial-to-parallel conversion shift register, an address counter connected to said first parallel-to-serial conversion shift register, a corrector, and a selector connected to said second parallel-to-serial conversion shift register, said address counter and said corrector.

16. An error correcting circuit according to claim 14, wherein said operating section serves to perform operations concerning coefficients $\sigma_0$ to $\sigma_n$ and $\omega_0$ to $\omega_{n-1}$ of an error-locator polynomial $\sigma(z)$ and an error-evaluator polynomial $\omega(z)$ with $$\sigma(z) = \sigma_0 + \sigma_1 z + \sigma_2 z^2 + \ldots + \sigma_{n-1} z^{n-1} + \sigma \text{hd } n z^n$$

$$\omega(z) = \omega_0 + \omega_1 z + \omega_2 z^2 + \ldots + \omega_{n-1} z^{n-1}$$

said n representing a number of errors to be corrected z being a variable on the Galois field.

17. An error correcting circuit according to claim 15, wherein said $\sigma(z)$ Chien search circuit is adapted to sequentially substitute $\alpha^0$ to $\alpha^{-(n-1)}$ therein, where $\alpha$ is an element of the Galois Field.

18. An error correcting circuit according to claim 17, wherein said operating circuit is so arranged that a formal differential of $\sigma(\alpha^{-x})$ is applied thereto if a value $\sigma(\alpha^{-x})$ in an inverse of an error location or $\alpha^{-x}$ is made zero.

19. An error correcting circuit according to claim 18, wherein said $\omega(z)$ Chien search circuit is adapted to apply a value $\omega(\alpha^{-x})$ into said operating circuit in which a value of an error is derived on a formal differential $\sigma'(\alpha^{-x})$ and a value $\omega(\alpha^{-x})$ at a time when a control signal indicating zero is transmitted to said $\omega(z)$ Chien search circuit.

20. An error correcting circuit according to claim 19, wherein said serial-to-parallel conversion shift registers are so arranged that by repeating operations of transmitting said control signal indicating zero to said serial-to-parallel shift registers, and applying said location and said value of said error to said serial-to-parallel shift registers as well, said detected error data is stored as parallel data therein.

21. An error correcting circuit according to claim 20, wherein said parallel-to-serial conversion shift registers are so arranged that said parallel data is read by said shift registers at a time when pipelines are switched, and said value is converted in the same data sequence as said data train input to said error correcting circuit.

22. An error correcting circuit according to claim 21, wherein said corrected data outputting means is so arranged that said error location is Sequentially compared with addresses generated by an address counter, and in case that said error locations are matched, a match signal is sent to a selector and only an error symbol is corrected in a corrector before outputting.

23. An error correcting circuit according to claim 22, wherein said parallel-to-serial shift registers are shifted by one stage so that it is possible to execute a correction in a process of outputting said input data train without preparing an independent correcting process.

24. A decoding device for Reed-Solomon code which is arranged to have a plurality of individual circuits and to perform a decoding operation in a flow-process manner through a pipeline processing, each of said individual circuits corresponding to each of processes, said decoding device being adapted to be used in an operating circuit for Galois Field, said decoding device comprising:
   an input means for operating a syndrome according to an input data and for generating an erasure locator from a plurality of deleting flags at a time when deleting an error for correction;
   a polynomial generating means connected to said input means for deriving a coefficient of each degree of a predetermined polynomial according to a result output from said input means; and
   a polynomial estimating means connected to said polynomial generating means for deriving an error location and an error value by substituting an element of a Galois field into said predetermined polynomial.

25. A decoding device according to claim 24, wherein said input means is adapted to receive a code containing an error and to generate a syndrome according to a predetermined relation, said generated syndrome is sent to said polynomial generating means, and said input means starts to generate a syndrome of a next received code.

26. A decoding device according to claim 25, wherein said polynomial generating means is adapted to perform an operating process according to a program and to determine a number of errors from said syndrome according to predetermined relations.

27. A decoding device according to claim 28, wherein said polynomial generating means is further adapted to derive coefficients of an error locator polynomial, and to derive coefficients of an error evaluator polynomial according to a predetermined relation said syndrome, and so arranged that said error locator polynomial and said error evaluator polynomial derived in said polynomial generating means are sent to said polynomial estimating means so as to execute said process repeatedly at a time when said syndrome of said next received code is input to said polynomial generating means.

28. A decoding device according to claim 27, wherein said polynomial generating means is arranged to have a syndrome register, an erasure locator register, data buses, input registers, a first operating circuit, a second operating circuit, an instruction read-only-memory a program counter, an error locator polynomial register, an error evaluator polynomial register, and a checking register.

29. A decoding device according to claim 28, wherein said polynomial generating means is so arranged that said syndrome and said erasure locator output from said input means are held in said syndrome register and said erasure locator register, respectively.

30. A decoding device according to claim 29, wherein said polynomial generating means is so arranged that said data are selected by an instruction stored in said instruction read-only memory and output to said data buses, said data buses being connected to said input registers of said first operating circuit and said second operating circuit, said data stored in said input registers being processed in said first operating circuit and said data stored in said input registers being processed in said second operating circuit.

31. A decoding device according to claim 30, wherein said first operating circuit and said second operating circuit provide operating elements, said operating elements enabling execution of an addition and a multiplication on said Galois field according to an instruction, and said operated result being stored in addresses specified in operating registers according to an instruction, said operating registers being provided in said operating circuits, respectively.

32. A decoding device according to claim 31, wherein said first operating circuit and said second operating circuit are so arranged that outputs of said operating registers are connected to said data buses, a readout address being determined by an instruction in each independent bus, and a specific data bus in said data buses being used to output each degree coefficient of said error locator polynomial and said error evaluator polynomial and an error number and a checking syndrome.

33. A decoding device according to claim 81, wherein said first operating circuit and said second operating circuit are further arranged that an address of said instruction read-only memory is given by said program counter, said program counter being branched through said instruction read-only memory and an absolute or relative jump address being given from said instruction read-only memory.

34. A decoding device according to claim 88, wherein said first operating circuit and said second operating circuit are further arranged that several kinds of correcting algorithms are installed in said instruction read-only memory depending on a correcting mode, a code arrangement, a number of erasures, and an error number obtained by said polynomial generating means, said correcting algorithm being properly branched for executing a correcting process in a manner to flexibly and rapidly cope with an error condition.

35. A decoding device according to claim 24, wherein said polynomial estimating means is adapted to estimate an error locator polynomial and an error evaluator polynomial therein, and elements of said Galois field being sequentially substituted in an polynomial for obtaining necessary values to be put in a predetermined relation.

36. A decoding device according to claim 35, wherein said polynomial estimating means is so arranged that an error value is derived from a predetermined relation when estimating said error locator polynomial by separating a sum of only odd degree terms from a sum of all degree terms in said predetermined relation.

37. A decoding device according to claim 36, wherein said polynomial estimating means is further arranged that an error locator polynomial is set to be equal to zero and a sum of only even degree terms is made equal to a sum of only odd degree terms at a time when a solution of said error locator polynomial is obtained by a Chien search function, thereby a sum of only even odd terms may be used for obtaining same result in place of a sum of only odd degree terms in a predetermined relation.

38. A decoding device according to claim 37, wherein said polynomial estimating means is further arranged that for an error location output from said polynomial estimating means, a combination for giving an error locator polynomial to be equal to zero is output as a result of a Chien search, and an estimated result of a predetermined relation at each error location is output as an error value.

39. A decoding device according to claim 38, wherein said decoding device is so arranged that a number of errors obtained from said polynomial generating means is sent to said polynomial evaluator means and determined if said number is equal to a number of solutions of said error locator polynomial obtained by said polynomial evaluator means for checking a correcting process.

40. A decoding device according to claim 38, wherein said decoding device is so arranged that in case of non-used syndromes being left at a time when said polynomial generating means derives an error locator polynomial and an error evaluator polynomial, syndromes not used for decoding a received code are sent from said polynomial generating means to said polynomial evaluator means so that it is determined if an error location derived from said polynomial evaluator means matches to a syndrome verified from an error value for checking a correcting process.

41. A decoding device according to claim 38, wherein said polynomial evaluator means includes an error locator polynomial evaluator unit, an error location output unit connected to said error locator polynomial evaluator unit, an error value output unit connected to said error locator polynomial evaluator unit and said error location output unit, a syndrome verifying unit connected to said error value output unit, an error number output unit connected to said error value output unit, and a checked result output unit connected to said syndrome verifying unit and said error number output unit.

42. A decoding device according to claim 41, wherein said polynomial estimating means is so arranged that when estimating an error locator polynomial, said error locator polynomial estimating unit operates to divide said error locator polynomial into even degree terms and odd degree terms and substitute elements of said Galois field into said even degree terms and said odd degree terms for obtaining a proper value of the polynomial, and when said error locator polynomial estimating unit finds a solution, said error location output unit operates to gate an output of an error location pointer synchronized with said elements of said Galois field to be substituted by means of a find signal for obtaining an error location, thereby said error value output unit serves to gate an error location pointer by means of a find signal for obtaining an error value.

43. A decoding device according to claim 42, wherein said syndrome verifying unit serves to compare a syndrome derived for trial from an error with a verifying syndrome sent from said polynomial generating means as a check for a corrected result and to determine that a verified result is correct if matched, said error number output unit compares a count of solutions found through said Chien search with an error number sent from said polynomial generating means and determines that said error number is correct if matched, and said checked result output unit serves to output a logic OR of outputs from said syndrome verifying unit and said error number output unit as a checked result output from said polynomial estimating means.

44. A verifying circuit of an error-corrected result for verifying a syndrome with a corrected result given by an error correcting circuit used for recording or reproducing digital data, said verifying circuit being adapted to be used in an operating circuit for Galois field, said verifying circuit comprising:

operating means for outputting an operated result obtained according to a predetermined relation formula from a syndrome obtained through an addition of Galois field between a data train to be input to said error correcting circuit and an error location; and determining means connected to said operating means for determining whether or not said operated result is a specific value.

45. A verifying circuit according to claim 44, wherein said verifying circuit is arranged to have a selecting circuit, a first adder served as operating means connected to said selecting circuit, a second adder connected to said first adder, a flip-flop and a multiplier both connected to said second adder, and an AND circuit served as determining means connected to said selecting circuit, said second adder and said multiplier.

46. A verifying circuit according to claim 45, wherein said selecting circuit is adapted to receive a syndrome used for a verification as an input signal at an input terminal thereof, to receive a synchronous reset signal at a control terminal thereof, said synchronous reset signal being held low only when a first data of said data train is inputted to said verifying circuit and to supply said input signal without any change when said control terminal is set at low level and to supply a zero signal when said control terminal is set at high level.

47. A verifying circuit according to claim 46, wherein said first adder is adapted to receive an output from said selecting circuit and a data train indicating an error size, and to supply an output to a circuit disposed in said second adder, said flip-flop, and said multiplier.

48. A verifying circuit according to claim 47, wherein said verifying circuit is so arranged that when data indicating a last error size is read by said flip-flop, said circuit supplies an output, and it is determined that a correction is proper depending on whether or not a value of a predetermined relation is zero, and a reset signal is input to said AND circuit so as to initialize said flip-flop.

49. A verifying circuit according to claim 48, wherein said verifying circuit is so arranged that said verifying circuit generates a syndrome by a Galois field operation between said error value train output from said error correcting circuit and said error location and verified result from a generated Syndrome, and said verifying circuit is adapted to perform an operation of determining whether or not said verified result is zero when a last data at an output of a Chien search is input to said circuit, said determined result indicating whether said error correcting is done properly or not.

50. An error correcting circuit adapted to be used in an operating circuit for Galois field comprising:

first converting means for receiving first data as parallel data and outputting said first data as serial data;

second converting means for receiving second data as parallel data and outputting said second data as serial data;

a counter for outputting third data;

determining means connected to said second converting means and said counter for receiving said second data output from said second converting means and said third data output from said counter, for determining whether or not said second data matches to said third data, and for sending a predetermined signal to said first converting means and said second converting means according to said determined result; and selecting means connected to said first converting means and said determining means for receiving said first data output from said first converting means and for outputting said first data received at a time when said predetermined signal output from said determining means is received.

51. An error correcting circuit according to claim 50, wherein said error correcting circuit is arranged to have a shift register served as first converting means, a shift register served as second converting means, a selecting circuit served as selecting means connected to said shift register, a comparator served as determined means connected to said shift register and said selecting circuit, an address counter served as counter means connected to said comparator, and an adder connected to said selecting circuit.

52. An error correcting circuit according to claim 51, wherein said error correcting circuit is further arranged that error location data for said second data is sequentially inputted to said shift register serving as said second converting means, said error location data representing locations of symbols with error in an inputted data train, an order of error location data train being the same as an order of inputted data train to be inputted to said error correcting circuit.

53. An error correcting circuit according to claim 52, wherein said error correcting circuit is further arranged that said first data is stored in said shift register in an magnitude order and said address counter operates to count said input data to said error correcting circuit from said head side synchronous with said delayed input data, said count value corresponding to said third data is compared with said output of said shift register in said comparator.

54. An error correcting circuit according to claim 58, wherein said error correcting circuit is further arranged that if said count value corresponding to said third data is not matched with said output of said shift register in said comparator, a non-match signal is sent to said shift register, said shift register and said selecting circuit in a manner to prohibit data shift in said shift registers and indicate an output of zero in said selecting circuit, and said symbol determined not to be erroneous in said delayed input data train is output to an external.

55. An error correcting circuit according to claim 54, wherein said error correcting circuit is further arranged that if said count value corresponding to said third data is matched, said comparator sends a match signal corresponding to a predetermined signal to said shift register, said shift register and said selecting circuit, and said selecting circuit outputs data about an error value and said adder corrects said input data, said shift registers being adapted to shift said data by one stage for waiting a next correction.

56. An error correcting circuit adapted to be used in an operating circuit for Galois field comprising:

first and second converting means for receiving first data and second data as parallel data and for outputting said first data and said second data as serial data, respectively;

a counter for outputting third data;

determining means connected to said second converting means and said counter for receiving said second data output from said second converting means and said third data output from said counter, for determining whether or not said second data matches to said third data, and for sending a predetermined signal to said first converting means and said second converting means according to said determined result;

means for forming delayed input data;

operating means for operating said first data; and selecting means for selecting one of said delayed input data and said signal output from said operating means.

57. An error correcting circuit according to claim 56, wherein said selecting means is provided at a last stage so as to select an added result of said delayed input data and said output of said first converting means in response to a control signal before outputting.

58. An error correcting circuit according to claim 57, wherein said selecting means is adapted to receive said delayed input data train and an output of said adder for constantly adding said output of said first converting means to said delayed input data train.

59. An error correcting circuit according to claim 58, wherein said operating means is adapted to send error location data to said second converting means, and said determining means compares an address value counted by said counter with said error location data sent from said converting means.

60. An error correcting circuit according to claim 59, wherein said error correcting circuit is so arranged that when said address value counted by said counter is not matched with said error location data sent from said second converting means, and said determining means sends a non-match signal to said first and second converting means and said selecting means so as to indicate a prohibit of data conversion to said converting means and a prohibit of correction in said selecting means, and a symbol determined not to be erroneous in said delayed input data train is output to an external of said error correcting circuit.

61. An error correcting circuit according to claim 60, wherein said error correcting circuit further includes an adder, and said error correcting circuit is so arranged that when said address value counted by said counter is matched with said error location data sent from said converting means in said determining means, said determining means sends a match signal to said converting means and said selecting means, and said selecting means is adapted to select an output of said adder for constantly adding said input data train to said output of said converting means for executing a correction of said input data.

62. An error correcting circuit according to claim 61, wherein said error correcting circuit is so arranged that said converting means is adapted to shift said data by one stage and output next error location data and error value data for waiting a correction of said next error value data.

63. An error correcting circuit according to claim 56, wherein said error correcting circuit is adapted to utilize a method for decoding Reed-Solomon codes of minimum distance d for solving n-stage simultaneous linear equations of $$S_k = \sum_{i=1}^{n} X_i^k E_i$$

where $k=0, 1, \ldots, d-2$, and for deriving an error number m as largest integer allowing m-degree square matrix $G_m'$ to be non-singluar independent of a number h of erasure, with said m-degree square matrix $G_m'$ being represented as $$G_m' = \begin{pmatrix} T_{d-m-2} & T_{d-m-3} & \cdots & T_{d-2m-1} \\ T_{d-m-1} & T_{d-m-2} & \cdots & T_{d-2m} \\ \cdot & \cdot & & \cdot \\ \cdot & \cdot & & \cdot \\ \cdot & \cdot & & \cdot \\ T_{d-3} & T_{d-4} & \cdots & T_{d-m-2} \end{pmatrix}$$

where $T_i$ ($0 \leq i \leq d-2$) is defined with a following expression:

$$\left\{ \prod_{i=1}^{h}(1 - X_i z) \right\} \left( \sum_{i=0}^{d-2} s_i z^i \right) = \sum_{i=0}^{d-2} T_i z^i \pmod{z^{d-1}}$$

with $S_k$ denoting a k-th syndrome, $X_i$ denoting a i-th erasure location ($1 \leq i \leq h$) or an (i−h) th error value ($h+1 \leq i \leq h$), $E_i$ denoting an error value of an i-th erasure ($1 \leq i \leq h$) or an error value of an (i-h) th error, $n=h+m$ denoting a total number of erasure and errors, x and z denoting a variable on Galois field.

64. An error correcting circuit according to claim 63, wherein said error correcting circuit includes a data bus, an operating unit, a group of working registers, a read-only memory for storing a microcode, a random-access memory for storing a transmitted word or a received word, a readout register, a write register, and a control circuit for operating to sequentially read a microcode from said read-only memory in a manner to control an operation of said error correcting circuit.

65. An error correcting circuit according to claim 64, wherein said error correcting circuit is adapted to read out a received word from said random-access memory, to correct said received word, and to write said corrected and received word in said random-access memory for decoding said corrected and received word.

66. An error correcting circuit according claim 65, wherein said error correcting circuit is so arranged that an correction for said received word is executed to perform necessary operations such as additions and multiplications through said operating unit as storing an intermediate result of an operation in said group of working registers for deriving an error location and an error value.

67. An error correcting circuit according to claim 66, wherein said error correcting circuit is further arranged that said received word is read out through said readout register and said received word is corrected through said write register.

68. An error correcting circuit according to claim 67, wherein said error correcting circuit is so arranged that when said erasure plus error correction is performed in said error correcting circuit, an error number m can be obtained as largest integer allowing an m-degree square matrix $G_m'$ to be non-singular independent of an erasure number h, said m-degree square matrix $G_m'$ being represented as $$G_m' = \begin{pmatrix} T_{d-m-2} & T_{d-m-3} & \cdots & T_{d-2m-1} \\ T_{d-m-1} & T_{d-m-2} & \cdots & T_{d-2m} \\ \cdot & \cdot & & \cdot \\ \cdot & \cdot & & \cdot \\ \cdot & \cdot & & \cdot \\ T_{d-3} & T_{d-4} & \cdots & T_{d-m-2} \end{pmatrix}$$

where $T_i (0 \leq i \leq d-2$ is defined with a following expression:

$$\left\{ \prod_{i=1}^{h} (1 - X_i z) \right\} \left( \sum_{i=0}^{d-2} s_i z^i \right) = \left( \sum_{i=0}^{d-2} T_i z^i \right) (\bmod \ z^{d-1})$$

with $h+2m \leq d-1$ $h \geq 1$, thereby, coefficients $\sigma_1, \sigma_2, \ldots, \sigma_m$ of an error locator polynomial $\sigma(z)$ for only errors defined by $$\sigma(z) = \prod_{i=1}^{m} (1 - X_{h+i} z) = \sum_{i=0}^{m} \sigma_i z^i$$

are obtained by the following linear equation of $$G_m' \begin{pmatrix} \sigma_1 \\ \sigma_2 \\ \cdot \\ \cdot \\ \cdot \\ \sigma_m \end{pmatrix} = \begin{pmatrix} T_{d-m-1} \\ T_{d-m} \\ \cdot \\ \cdot \\ \cdot \\ T_{d-2} \end{pmatrix},$$

and resulting in that coefficients from a (d-m-1) th (note:$h+2m \leq d-1$ to $d-m-1 \geq h+m=n \geq 1$) degree to a (d-2) th degree on a left side are made zero so that, $$T_i \sigma_0 + T_{i-i} \sigma_m = 0,$$

where $i = d-m-1, d-m, \ldots, d-2$ and since $\sigma_0 = 1$ is given, the following simultaneous linear equations are established, $$T_{i-1} \sigma_1 + T_{i-2} \sigma_2 + \ldots + T_{i-m} \sigma_m = T_i,$$

where $i = d-m-1, d-m, \ldots, d-2$ as a matrix representation of these equations corresponds to the expression.

* * * * *